US012457718B2

(12) United States Patent
Gose et al.

(10) Patent No.: US 12,457,718 B2
(45) Date of Patent: Oct. 28, 2025

(54) SYSTEMS AND METHODS FOR GATE LEAKAGE DETECTION FOR INVERTER FOR ELECTRIC VEHICLE

(71) Applicant: BorgWarner US Technologies LLC, Wilmington, DE (US)

(72) Inventors: Mark Wendell Gose, Kokomo, IN (US); Seyed R. Zarabadi, Kokomo, IN (US); Narendra Mane, Kokomo, IN (US)

(73) Assignee: BORGWARNER US TECHNOLOGIES LLC, Wilmington, DE (US)

( * ) Notice: Subject to any disclaimer, the term of this patent is extended or adjusted under 35 U.S.C. 154(b) by 162 days.

(21) Appl. No.: 18/169,401

(22) Filed: Feb. 15, 2023

(65) Prior Publication Data

US 2024/0100954 A1 Mar. 28, 2024

Related U.S. Application Data

(60) Provisional application No. 63/377,486, filed on Sep. 28, 2022, provisional application No. 63/377,501, (Continued)

(51) Int. Cl.
*G01R 31/08* (2020.01)
*B60L 3/00* (2019.01)
(Continued)

(52) U.S. Cl.
CPC ........... *H02M 7/5387* (2013.01); *B60L 3/003* (2013.01); *B60L 15/007* (2013.01); *B60L 15/08* (2013.01);
(Continued)

(58) Field of Classification Search
CPC . G01R 15/20; H02P 29/0241; H02P 29/0243; H02M 7/5387
See application file for complete search history.

(56) References Cited

U.S. PATENT DOCUMENTS 4,054,828 A 10/1977 Conzelmann et al.
4,128,801 A 12/1978 Gansert et al.
(Continued)

FOREIGN PATENT DOCUMENTS

EP 3076549 A1 10/2016
WO 2007093598 A1 8/2007
(Continued)

OTHER PUBLICATIONS

Maniar, K., et al., "Addressing High-voltage Design Challenges With Reliable and Affordable Isolation Technologies," 2024, pp. 1-12. Retrieved from internet URL: https://www.ti.com/lit/wp/slyy204c/slyy204c.pdf ts=1710508127616&ref_url=https%253A%252F%252Fwww.google.com%252F.
(Continued)

*Primary Examiner* — Alesa Allgood
(74) *Attorney, Agent, or Firm* — Joshua M. Haines; Bookoff McAndrews, PLLC

(57) ABSTRACT

A system includes an inverter configured to convert DC power from a battery to AC power to drive a motor, wherein the inverter includes: one or more controllers configured to provide a test signal to control a gate leakage detection operation, and a power module including: a phase switch including one or more phase power switches, and a point-of-use controller configured to detect a gate leakage of the phase switch based on the test signal.

18 Claims, 12 Drawing Sheets

Related U.S. Application Data filed on Sep. 28, 2022, provisional application No. 63/377,512, filed on Sep. 28, 2022, provisional application No. 63/378,601, filed on Oct. 6, 2022.

(51) Int. Cl.

| | | |
|---|---|---|
| *B60L 15/00* | (2006.01) | |
| *B60L 15/08* | (2006.01) | |
| *B60L 50/40* | (2019.01) | |
| *B60L 50/51* | (2019.01) | |
| *B60L 50/60* | (2019.01) | |
| *B60L 50/64* | (2019.01) | |
| *B60L 53/20* | (2019.01) | |
| *B60L 53/22* | (2019.01) | |
| *B60L 53/62* | (2019.01) | |
| *B60R 16/02* | (2006.01) | |
| *G01R 15/20* | (2006.01) | |
| *G06F 1/08* | (2006.01) | |
| *G06F 13/40* | (2006.01) | |
| *H01L 21/48* | (2006.01) | |
| *H01L 23/00* | (2006.01) | |
| *H01L 23/15* | (2006.01) | |
| *H01L 23/367* | (2006.01) | |
| *H01L 23/373* | (2006.01) | |
| *H01L 23/40* | (2006.01) | |
| *H01L 23/467* | (2006.01) | |
| *H01L 23/473* | (2006.01) | |
| *H01L 23/495* | (2006.01) | |
| *H01L 23/538* | (2006.01) | |
| *H01L 25/00* | (2006.01) | |
| *H01L 25/07* | (2006.01) | |
| *H02J 7/00* | (2006.01) | |
| *H02M 1/00* | (2006.01) | |
| *H02M 1/08* | (2006.01) | |
| *H02M 1/084* | (2006.01) | |
| *H02M 1/088* | (2006.01) | |
| *H02M 1/12* | (2006.01) | |
| *H02M 1/32* | (2007.01) | |
| *H02M 1/42* | (2007.01) | |
| *H02M 1/44* | (2007.01) | |
| *H02M 3/335* | (2006.01) | |
| *H02M 7/00* | (2006.01) | |
| *H02M 7/537* | (2006.01) | |
| *H02M 7/5387* | (2007.01) | |
| *H02M 7/5395* | (2006.01) | |
| *H02P 27/06* | (2006.01) | |
| *H02P 27/08* | (2006.01) | |
| *H02P 29/024* | (2016.01) | |
| *H02P 29/68* | (2016.01) | |
| *H05K 1/14* | (2006.01) | |
| *H05K 1/18* | (2006.01) | |
| *H05K 5/02* | (2006.01) | |
| *H05K 7/20* | (2006.01) | |
| *H10D 64/01* | (2025.01) | |
| *B60L 15/20* | (2006.01) | |
| *H03K 19/20* | (2006.01) | |

(52) U.S. Cl.
CPC .............. *B60L 50/40* (2019.02); *B60L 50/51* (2019.02); *B60L 50/60* (2019.02); *B60L 50/64* (2019.02); *B60L 53/20* (2019.02); *B60L 53/22* (2019.02); *B60L 53/62* (2019.02); *B60R 16/02* (2013.01); *G01R 15/20* (2013.01); *G06F 1/08* (2013.01); *G06F 13/4004* (2013.01); *H01L 21/4882* (2013.01); *H01L 23/15* (2013.01); *H01L 23/3672* (2013.01); *H01L 23/3675* (2013.01); *H01L 23/3735* (2013.01); *H01L 23/4006* (2013.01); *H01L 23/467* (2013.01); *H01L 23/473* (2013.01); *H01L 23/49562* (2013.01); *H01L 23/5383* (2013.01); *H01L 24/32* (2013.01); *H01L 24/33* (2013.01); *H01L 25/072* (2013.01); *H01L 25/50* (2013.01); *H02J 7/0063* (2013.01); *H02M 1/0009* (2021.05); *H02M 1/0054* (2021.05); *H02M 1/08* (2013.01); *H02M 1/084* (2013.01); *H02M 1/088* (2013.01); *H02M 1/123* (2021.05); *H02M 1/32* (2013.01); *H02M 1/322* (2021.05); *H02M 1/327* (2021.05); *H02M 1/4258* (2013.01); *H02M 1/44* (2013.01); *H02M 3/33523* (2013.01); *H02M 7/003* (2013.01); *H02M 7/537* (2013.01); *H02M 7/53871* (2013.01); *H02M 7/53875* (2013.01); *H02M 7/5395* (2013.01); *H02P 27/06* (2013.01); *H02P 27/08* (2013.01); *H02P 27/085* (2013.01); *H02P 29/024* (2013.01); *H02P 29/027* (2013.01); *H02P 29/68* (2016.02); *H05K 1/145* (2013.01); *H05K 1/181* (2013.01); *H05K 1/182* (2013.01); *H05K 5/0247* (2013.01); *H05K 7/20154* (2013.01); *H05K 7/2039* (2013.01); *H05K 7/2049* (2013.01); *H05K 7/20854* (2013.01); *H05K 7/209* (2013.01); *H05K 7/20927* (2013.01); *H10D 64/018* (2025.01); *B60L 15/20* (2013.01); *B60L 2210/30* (2013.01); *B60L 2210/40* (2013.01); *B60L 2210/42* (2013.01); *B60L 2210/44* (2013.01); *B60L 2240/36* (2013.01); *G06F 2213/40* (2013.01); *H01L 2023/405* (2013.01); *H01L 2023/4087* (2013.01); *H01L 2224/32225* (2013.01); *H01L 2224/32245* (2013.01); *H01L 2224/33181* (2013.01); *H02J 2207/20* (2020.01); *H02P 2207/05* (2013.01); *H03K 19/20* (2013.01); *H05K 2201/042* (2013.01); *H05K 2201/10166* (2013.01)

(56) References Cited

U.S. PATENT DOCUMENTS

| | | |
|---|---|---|
| 4,564,771 A | 1/1986 | Flohrs |
| 4,618,875 A | 10/1986 | Flohrs |
| 4,716,304 A | 12/1987 | Fiebig et al. |
| 5,068,703 A | 11/1991 | Conzelmann et al. |
| 5,432,371 A | 7/1995 | Denner et al. |
| 5,559,661 A | 9/1996 | Meinders |
| 5,654,863 A | 8/1997 | Davies |
| 5,764,007 A | 6/1998 | Jones |
| 5,841,312 A | 11/1998 | Mindl et al. |
| 6,028,470 A | 2/2000 | Michel et al. |
| 6,163,138 A | 12/2000 | Kohl et al. |
| 6,351,173 B1 | 2/2002 | Ovens et al. |
| 6,426,857 B1 | 7/2002 | Doster et al. |
| 6,597,556 B1 | 7/2003 | Michel et al. |
| 6,812,553 B2 | 11/2004 | Gerbsch et al. |
| 6,943,293 B1 | 9/2005 | Jeter et al. |
| 7,095,098 B2 | 8/2006 | Gerbsch et al. |
| 7,229,855 B2 | 6/2007 | Murphy |
| 7,295,433 B2 | 11/2007 | Taylor et al. |
| 7,459,954 B2 | 12/2008 | Kuehner et al. |
| 7,538,425 B2 | 5/2009 | Myers et al. |
| 7,551,439 B2 | 6/2009 | Peugh et al. |
| 7,616,047 B2 | 11/2009 | Rees et al. |
| 7,724,046 B2 | 5/2010 | Wendt et al. |
| 7,750,720 B2 | 7/2010 | Dittrich |
| 8,897,043 B2 * | 11/2014 | Usami .................. H02M 7/219 363/125 |
| 9,088,159 B2 | 7/2015 | Peuser |

(56) References Cited

U.S. PATENT DOCUMENTS

| | | |
|---|---|---|
| 9,275,915 B2 | 3/2016 | Heinisch et al. |
| 9,373,970 B2 | 6/2016 | Feuerstack et al. |
| 9,431,932 B2 | 8/2016 | Schmidt et al. |
| 9,515,584 B2 | 12/2016 | Koller et al. |
| 9,548,675 B2 | 1/2017 | Schoenknecht |
| 9,806,607 B2 | 10/2017 | Ranmuthu et al. |
| 9,843,320 B2 | 12/2017 | Richter et al. |
| 9,871,444 B2 | 1/2018 | Ni et al. |
| 9,882,490 B2 | 1/2018 | Veeramreddi et al. |
| 10,111,285 B2 | 10/2018 | Shi et al. |
| 10,116,300 B2 | 10/2018 | Blasco et al. |
| 10,232,718 B2 | 3/2019 | Trunk et al. |
| 10,270,354 B1 | 4/2019 | Lu et al. |
| 10,291,225 B2 | 5/2019 | Li et al. |
| 10,525,847 B2 | 1/2020 | Strobel et al. |
| 10,797,579 B2 | 10/2020 | Hashim et al. |
| 10,924,001 B2 | 2/2021 | Li et al. |
| 11,082,052 B2 | 8/2021 | Jang et al. |
| 11,108,389 B2 | 8/2021 | Li et al. |
| 11,342,911 B2 | 5/2022 | Lee et al. |
| 11,838,011 B2 | 12/2023 | Li et al. |
| 11,843,320 B2 | 12/2023 | Sivakumar et al. |
| 11,848,426 B2 | 12/2023 | Zhang et al. |
| 11,851,038 B2 | 12/2023 | Solanki et al. |
| 11,855,522 B2 | 12/2023 | Rudolph et al. |
| 11,855,630 B2 | 12/2023 | Dake et al. |
| 11,870,338 B1 | 1/2024 | Narayanasamy |
| 11,872,997 B2 | 1/2024 | Hoos et al. |
| 11,881,859 B2 | 1/2024 | Gupta et al. |
| 11,888,391 B2 | 1/2024 | Balasubramanian et al. |
| 11,888,393 B2 | 1/2024 | Venkateswaran et al. |
| 11,901,803 B2 | 2/2024 | Ruck et al. |
| 11,901,881 B1 | 2/2024 | Narayanasamy |
| 11,909,319 B2 | 2/2024 | Esteghlal et al. |
| 11,916,426 B2 | 2/2024 | Oner et al. |
| 11,923,762 B2 | 3/2024 | Sethumadhavan et al. |
| 11,923,764 B1 | 3/2024 | Zhang |
| 11,923,799 B2 | 3/2024 | Ojha et al. |
| 11,925,119 B2 | 3/2024 | Male et al. |
| 11,927,624 B2 | 3/2024 | Patel et al. |
| 11,938,838 B2 | 3/2024 | Simonis et al. |
| 11,942,927 B2 | 3/2024 | Purcarea et al. |
| 11,942,934 B2 | 3/2024 | Ritter |
| 11,945,331 B2 | 4/2024 | Blemberg et al. |
| 11,945,522 B2 | 4/2024 | Matsumura et al. |
| 11,949,320 B2 | 4/2024 | Jaladanki et al. |
| 11,949,333 B2 | 4/2024 | Pahkala et al. |
| 11,955,896 B2 | 4/2024 | Liu et al. |
| 11,955,953 B2 | 4/2024 | Sinn et al. |
| 11,955,964 B2 | 4/2024 | Agarwal et al. |
| 11,962,234 B2 | 4/2024 | Narayanasamy et al. |
| 11,962,291 B2 | 4/2024 | Oberdieck et al. |
| 11,964,587 B2 | 4/2024 | Yukawa |
| 11,970,076 B2 | 4/2024 | Sarfert et al. |
| 11,977,404 B2 | 5/2024 | Chandrasekaran |
| 11,984,802 B2 | 5/2024 | Merkin et al. |
| 11,984,876 B2 | 5/2024 | Neidorff et al. |
| 11,990,776 B2 | 5/2024 | Dulle |
| 11,990,777 B2 | 5/2024 | Woll et al. |
| 11,996,686 B2 | 5/2024 | Chan et al. |
| 11,996,699 B2 | 5/2024 | Vasconcelos Araujo et al. |
| 11,996,714 B2 | 5/2024 | El Markhi et al. |
| 11,996,715 B2 | 5/2024 | Nandi et al. |
| 11,996,762 B2 | 5/2024 | Hembach et al. |
| 11,996,830 B2 | 5/2024 | Murthy et al. |
| 11,996,847 B1 | 5/2024 | Kazama et al. |
| 12,003,191 B2 | 6/2024 | Chaudhary et al. |
| 12,003,229 B2 | 6/2024 | Kaya et al. |
| 12,003,237 B2 | 6/2024 | Waters |
| 12,008,847 B2 | 6/2024 | Braun et al. |
| 12,009,679 B2 | 6/2024 | Gottwald et al. |
| 12,012,057 B2 | 6/2024 | Schneider et al. |
| 12,015,342 B2 | 6/2024 | Kienzler et al. |
| 12,019,112 B2 | 6/2024 | Jarmolowitz et al. |
| 12,021,517 B2 | 6/2024 | S et al. |
| 2009/0290050 A1* | 11/2009 | Herrmann ............ H04N 25/671 348/E9.042 |
| 2010/0073994 A1* | 3/2010 | Khalil ................... G11C 8/14 365/226 |
| 2014/0078802 A1* | 3/2014 | Ozkan .................. H02J 3/381 363/132 |
| 2014/0239189 A1* | 8/2014 | Sakino .................. G01T 1/247 250/394 |
| 2016/0018446 A1 | 1/2016 | Chen et al. |
| 2017/0192049 A1* | 7/2017 | Tavernier .......... G01R 31/3008 |
| 2017/0331469 A1 | 11/2017 | Kilb et al. |
| 2019/0081466 A1* | 3/2019 | Ha ...................... G01R 19/165 |
| 2020/0195121 A1 | 6/2020 | Keskar et al. |
| 2021/0005711 A1 | 1/2021 | Martinez-Limia et al. |
| 2021/0344187 A1* | 11/2021 | Namuduri ............ H02H 3/0935 |
| 2022/0052610 A1 | 2/2022 | Plum |
| 2022/0294441 A1 | 9/2022 | Purcarea et al. |
| 2023/0010616 A1 | 1/2023 | Gschwantner et al. |
| 2023/0061922 A1 | 3/2023 | Ritter |
| 2023/0082076 A1 | 3/2023 | Strache et al. |
| 2023/0126070 A1 | 4/2023 | Oberdieck et al. |
| 2023/0179198 A1 | 6/2023 | Winkler |
| 2023/0231210 A1 | 7/2023 | Joos et al. |
| 2023/0231400 A1 | 7/2023 | Oberdieck et al. |
| 2023/0231496 A1 | 7/2023 | Syed et al. |
| 2023/0238808 A1 | 7/2023 | Swoboda et al. |
| 2023/0268826 A1 | 8/2023 | Yan et al. |
| 2023/0327597 A1* | 10/2023 | Bourniche .............. H02P 27/08 |
| 2023/0335509 A1 | 10/2023 | Poddar |
| 2023/0365086 A1 | 11/2023 | Schumacher et al. |
| 2023/0370062 A1 | 11/2023 | Wolf |
| 2023/0378022 A1 | 11/2023 | Kim et al. |
| 2023/0386963 A1 | 11/2023 | Kim et al. |
| 2023/0402930 A1 | 12/2023 | Corry et al. |
| 2023/0420968 A1 | 12/2023 | Oner et al. |
| 2023/0421049 A1 | 12/2023 | Neidorff |
| 2024/0006869 A1 | 1/2024 | Kim et al. |
| 2024/0006899 A1 | 1/2024 | Wernerus |
| 2024/0006978 A1* | 1/2024 | Onda ..................... H02M 1/32 |
| 2024/0006993 A1 | 1/2024 | Barjati et al. |
| 2024/0022187 A1 | 1/2024 | Fassnacht |
| 2024/0022240 A1 | 1/2024 | Balaz |
| 2024/0022244 A1 | 1/2024 | S et al. |
| 2024/0030730 A1 | 1/2024 | Wernerus |
| 2024/0039062 A1 | 2/2024 | Wernerus |
| 2024/0039402 A1 | 2/2024 | Bafna et al. |
| 2024/0039406 A1 | 2/2024 | Chen et al. |
| 2024/0048048 A1 | 2/2024 | Zhang |
| 2024/0055488 A1 | 2/2024 | Lee et al. |
| 2024/0067116 A1 | 2/2024 | Qiu |
| 2024/0072675 A1 | 2/2024 | Formenti et al. |
| 2024/0072817 A1 | 2/2024 | K et al. |
| 2024/0077899 A1 | 3/2024 | Chitnis et al. |
| 2024/0078204 A1 | 3/2024 | Roehrle et al. |
| 2024/0079950 A1 | 3/2024 | Narayanasamy |
| 2024/0079958 A1 | 3/2024 | Kumar et al. |
| 2024/0080028 A1 | 3/2024 | Dake et al. |
| 2024/0088647 A1 | 3/2024 | Ramadass et al. |
| 2024/0088896 A1 | 3/2024 | Bilhan et al. |
| 2024/0097437 A1 | 3/2024 | Goyal et al. |
| 2024/0097459 A1 | 3/2024 | Swoboda et al. |
| 2024/0105276 A1 | 3/2024 | Duryea |
| 2024/0106248 A1 | 3/2024 | Woll et al. |
| 2024/0106435 A1 | 3/2024 | Zhang et al. |
| 2024/0113517 A1 | 4/2024 | Sriraj et al. |
| 2024/0113611 A1 | 4/2024 | Kaufmann et al. |
| 2024/0113620 A1 | 4/2024 | Ranmuthu et al. |
| 2024/0113624 A1 | 4/2024 | Southard et al. |
| 2024/0120558 A1 | 4/2024 | Zhang et al. |
| 2024/0120765 A1 | 4/2024 | Oner et al. |
| 2024/0120962 A1 | 4/2024 | Miriyala et al. |
| 2024/0128851 A1 | 4/2024 | Ruck et al. |
| 2024/0128859 A1 | 4/2024 | Chen |
| 2024/0128867 A1 | 4/2024 | Wang et al. |
| 2024/0146177 A1 | 5/2024 | Mehdi et al. |
| 2024/0146306 A1 | 5/2024 | Ramkaj et al. |
| 2024/0149734 A1 | 5/2024 | Eisenlauer |
| 2024/0162723 A1 | 5/2024 | Zipf et al. |
| 2024/0178756 A1 | 5/2024 | El-Markhi et al. |

(56) References Cited

U.S. PATENT DOCUMENTS

| | | |
|---|---|---|
| 2024/0178824 A1 | 5/2024 | Kazama et al. |
| 2024/0186803 A1 | 6/2024 | Krieg et al. |
| 2024/0198937 A1 | 6/2024 | Benqassmi et al. |
| 2024/0198938 A1 | 6/2024 | Carlos et al. |
| 2024/0204540 A1 | 6/2024 | Majmunovic et al. |
| 2024/0204541 A1 | 6/2024 | Majmunovic et al. |
| 2024/0204671 A1 | 6/2024 | Liu et al. |
| 2024/0204765 A1 | 6/2024 | Dake |
| 2024/0213874 A1 | 6/2024 | Junnarkar et al. |
| 2024/0213971 A1 | 6/2024 | Lee |
| 2024/0213975 A1 | 6/2024 | Narayanasamy |
| 2024/0213981 A1 | 6/2024 | Agarwal et al. |

FOREIGN PATENT DOCUMENTS

| | | |
|---|---|---|
| WO | 2019034505 A1 | 2/2019 |
| WO | 2020156820 A1 | 8/2020 |
| WO | 2020239797 A1 | 12/2020 |
| WO | 2021110405 A1 | 6/2021 |
| WO | 2021213728 A1 | 10/2021 |
| WO | 2022012943 A1 | 1/2022 |
| WO | 2022229149 A1 | 11/2022 |
| WO | 2023006491 A1 | 2/2023 |
| WO | 2023046607 A1 | 3/2023 |
| WO | 2023094053 A1 | 6/2023 |
| WO | 2023110991 A1 | 6/2023 |
| WO | 2023147907 A1 | 8/2023 |
| WO | 2023151850 A1 | 8/2023 |
| WO | 2023227278 A1 | 11/2023 |
| WO | 2023237248 A1 | 12/2023 |
| WO | 2024006181 A2 | 1/2024 |
| WO | 2024012743 A1 | 1/2024 |
| WO | 2024012744 A1 | 1/2024 |
| WO | 2024022219 A1 | 2/2024 |
| WO | 2024041776 A1 | 2/2024 |
| WO | 2024046614 A1 | 3/2024 |
| WO | 2024049730 A1 | 3/2024 |
| WO | 2024049884 A1 | 3/2024 |
| WO | 2024049909 A1 | 3/2024 |
| WO | 2024056388 A1 | 3/2024 |
| WO | 2024068065 A1 | 4/2024 |
| WO | 2024068076 A1 | 4/2024 |
| WO | 2024068113 A1 | 4/2024 |
| WO | 2024068115 A1 | 4/2024 |
| WO | 2024083391 A1 | 4/2024 |
| WO | 2024093384 A1 | 5/2024 |
| WO | 2024104970 A1 | 5/2024 |
| WO | 2024108401 A1 | 5/2024 |
| WO | 2024110106 A1 | 5/2024 |
| WO | 2024110265 A1 | 5/2024 |
| WO | 2024110297 A1 | 5/2024 |
| WO | 2024114978 A1 | 6/2024 |
| WO | 2024114979 A1 | 6/2024 |
| WO | 2024114980 A1 | 6/2024 |
| WO | 2024128286 A1 | 6/2024 |
| WO | 2024132249 A1 | 6/2024 |

OTHER PUBLICATIONS

"New products," 5 Pages, Retrieved from internet URL:https://www.ti.com/product-category/new-products.html?%20releasePeriod=364#releasePeriod=90.

"Qualcomm and Bosch Showcase New Central Vehicle Computer for Digital Cockpit and Driver Assistance Functions at CES 2024," 2024, 8 Pages. Retrieved from internet URL:https://www.qualcomm.com/news/releases/2024/01/qualcomm-and-bosch-showcase-new-central-vehicle-computer-for-dig.

Nguyen Thanh-That et al: "Gate Oxide Reliability Issues of SiC MOSFETs Under Short-Circuit Operation", IEEE Transactions on Power Electronics, Institute of Electrical and Electronics Engineers, USA, vol. 30, No. 5, May 1, 2015 (May 1, 2015), pp. 2445-2455.

Balogh, L., "Fundamentals of MOSFET and IGBT Gate Driver Circuits," Texas Instruments Application Report, SLUA618—Mar. 2017, Retrieved from internet URL: https://ghioni.faculty.polimi.it/pel/readmat/gate-drive.pdf, 65 pages.

Baranwal, S., "Common-mode transient immunity for isolated gate drivers," Analog Applications Journal, Texas Instruments (2015), Retrieved from internet URL: https://www.ti.com/lit/an/slyt648/slyt648.pdf?ts=1702052336068&ref_url=https%253A%252F%252Fwww.google.com%252F, 07 pages.

Boomer, K. and Ahmad H., "Performance Evaluation of an Automotive-Grade, High-Speed Gate Driver for SiC FETs, Type UCC27531, Over a Wide Temperature Range," NASA Electronic Parts and Packaging Program No. GRC-E-DAA-TN25898 (2015), Retrieved from Internet URL: https://ntrs.nasa.gov/api/citations/20150023034/downloads/20150023034.pdf, 08 pages.

Ke, X, et al., "A 3-to-40V 10-to-30MHz Automotive-Use GaN Driver with Active BST Balancing and VSW Dual-Edge Dead-Time Modulation Achieving 8.3% Efficiency Improvement and 3.4ns Constant Propagation Delay," 2016 IEEE International Solid-State Circuits Conference (ISSCC), IEEE, 2016, Retrieved from internet URL: https://picture.iczhiku.com/resource/IEEE/WYkrsJrSQPoSjNXm.pdf, 03 pages.

Sridhar, N., "Impact of an Isolated Gate Driver," Texas Instruments: Dallas, Texas (2019), Retrieved from Internet URL: https://www.ti.com/lit/wp/slyy140a/slyy140a.pdf, 08 pages.

Sridhar, N., "Power Electronics in Motor Drives: Where is it?" Texas Instruments (2015), Retrieved from Internet URL: https://www.ti.com/lit/wp/slyy078a/slyy078a.pdf, 09 pages.

Sridhar, N., "Silicon Carbide Gate Drivers—a Disruptive Technology in Power Electronics," Texas Instruments, Dallas, Texas (2019), Retrieved from Internet URL: https://www.ti.com/lit/wp/slyy139/slyy139.pdf, 07 pages.

F. Ertuk, B. Akin ,"A method for online ageing detection for SiC FETs", IEEE Ind. Paper 2017 IEEE Applied Power Electronics Conference and Exposition (APEC).

S.Kim, D.Han, X.Dong, H.Li, J.Moon "An Intelligent Gate Driver With Self-diagnosis and Prognosis for SiC MOSFETs", 2021 IEEE Energy Conversion Congress and Exposition (ECCE).

J.Weckbrodt, N.Ginot, C.Batard, S.Azzopardi "Monitoring of Gate Leakage Current on SiC Power MOSFETs: An Estimation Method for Smart Gate Drivers", IEEE Transactions on Power Electronics, vol. 36, No. 8, Aug. 2021.

\* cited by examiner

800

STEP 1:
802 — M1 = M2 = OFF STATE
804 — F1 = F3 = V1 → M3 Vgs = 0V
806 — F2 = 0V → M3 Vds = 0V
808 — M3 Vgs = Vds = 0 → I3 MUST BE 0
810 — CIRCUIT F1 MEASURES I4(1) = I2 - I1

STEP 2:
812 — M1 = M2 = OFF STATE
814 — F3 = 0V, F1 = V1 → M3 Vgs = V1
816 — F2 = 0V → M3 Vds = 0V
818 — M3 Vgs = V1 → I3 COULD BE NON-ZERO
820 — CIRCUIT F1 MEASURES I4(2) = I3 + I2 - I1

822 — STEP 3: I4(2) - I4(1) = I3

*FIG. 8*

SYSTEMS AND METHODS FOR GATE LEAKAGE DETECTION FOR INVERTER FOR ELECTRIC VEHICLE

CROSS-REFERENCE TO RELATED APPLICATION(S)

This application claims the benefit of priority to U.S. Provisional Patent Application No. 63/377,486, filed Sep. 28, 2022, U.S. Provisional Patent Application No. 63/377,501, filed Sep. 28, 2022, U.S. Provisional Patent Application No. 63/377,512, filed Sep. 28, 2022, and U.S. Provisional Patent Application No. 63/378,601, filed Oct. 6, 2022, the entireties of which are incorporated by reference herein.

TECHNICAL FIELD

Various embodiments of the present disclosure relate generally to systems and methods for gate leakage detection for an inverter for an electric vehicle, and, more particularly, to systems and methods for monitoring gate leakage of a power device switch for an inverter for an electric vehicle.

BACKGROUND

Inverters, such as those used to drive a motor in an electric vehicle, for example, are responsible for converting High Voltage Direct Current (HVDC) into Alternating Current (AC) to drive the motor. In an inverter, gate leakage of a power device switch can compromise the correct operation of the inverter.

The present disclosure is directed to overcoming one or more of these above-referenced challenges.

SUMMARY OF THE DISCLOSURE

In some aspects, the techniques described herein relate to a system including: an inverter configured to convert DC power from a battery to AC power to drive a motor, wherein the inverter includes: one or more controllers configured to provide a test signal to control a gate leakage detection operation; and a power module including: a phase switch including one or more phase power switches; and a point-of-use controller configured to detect a gate leakage of the phase switch based on the test signal.

In some aspects, the techniques described herein relate to a system, wherein the one or more phase power switches includes one or more silicon carbide dies.

In some aspects, the techniques described herein relate to a system, wherein the power module is configured to be connected to a terminal of the battery and a phase terminal of the motor.

In some aspects, the techniques described herein relate to a system, wherein a gate terminal of the one or more phase power switches is connected to the point-of-use controller inside the power module.

In some aspects, the techniques described herein relate to a system, wherein the point-of-use controller includes a resistor divider.

In some aspects, the techniques described herein relate to a system, wherein the point-of-use controller includes a current to voltage converter.

In some aspects, the techniques described herein relate to a system, wherein the point-of-use controller includes a switched capacitor amplifier circuit.

In some aspects, the techniques described herein relate to a system, further including: the battery configured to supply the DC power to the inverter; and the motor configured to receive the AC power from the inverter to drive the motor.

In some aspects, the techniques described herein relate to a system including: a power module for an inverter, the power module including: a phase switch including one or more phase power switches; and a point-of-use controller configured to detect a gate leakage of the phase switch.

In some aspects, the techniques described herein relate to a system, wherein the point-of-use controller includes an embedded gate leakage measurement circuit configured to detect the gate leakage of the phase switch.

In some aspects, the techniques described herein relate to a system, wherein: a drain terminal and a source terminal of the one or more phase power switches are externally accessible, and a gate terminal of the one or more phase power switches is not accessible from an outside of the power module.

In some aspects, the techniques described herein relate to a system, wherein the point-of-use controller is further configured to provide the detected gate leakage to one or more controllers of the inverter.

In some aspects, the techniques described herein relate to a system, wherein the detected gate leakage is an amount of gate to source leakage current of the one or more phase power switches at a gate to source voltage.

In some aspects, the techniques described herein relate to a system, wherein the point-of-use controller is further configured to detect a characteristic leakage for the point-of-use controller and to detect a gate leakage for the point-of-use controller and the one or more phase power switches.

In some aspects, the techniques described herein relate to a system including: one or more point-of use controllers for a power module, the one or more point-of use controllers configured to: detect a gate leakage of a power switch of the power module.

In some aspects, the techniques described herein relate to a system, wherein the one or more point-of use controllers is further configured to: receive a test voltage; apply a gate to source voltage to the power switch based on the test voltage; and measure a gate current of the power switch based on the gate to source voltage, as the detected gate leakage.

In some aspects, the techniques described herein relate to a system, wherein the one or more point-of use controllers is further configured to: apply the gate to source voltage as 0V; measure the gate current of the power switch as 0 A; and measure a current of the one or more point-of use controllers as a characteristic gate leakage of the one or more point-of use controllers.

In some aspects, the techniques described herein relate to a system, wherein the one or more point-of use controllers is further configured to: provide the detected gate leakage to one or more controllers of an inverter including the power module.

In some aspects, the techniques described herein relate to a system, wherein the one or more point-of use controllers is further configured to: provide the detected gate leakage to one or more controllers of a tester in an end-of-line test.

In some aspects, the techniques described herein relate to a system, wherein the one or more point-of use controllers is further configured to: detect the gate leakage of the power switch of the power module at every power up cycle for the power module.

Additional objects and advantages of the disclosed embodiments will be set forth in part in the description that follows, and in part will be apparent from the description, or may be learned by practice of the disclosed embodiments.

The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

FIG. 8 depicts an exemplary procedure for operating the point-of-use test system of FIG. 7, according to one or more embodiments.

DETAILED DESCRIPTION OF EMBODIMENTS

Figure 1:
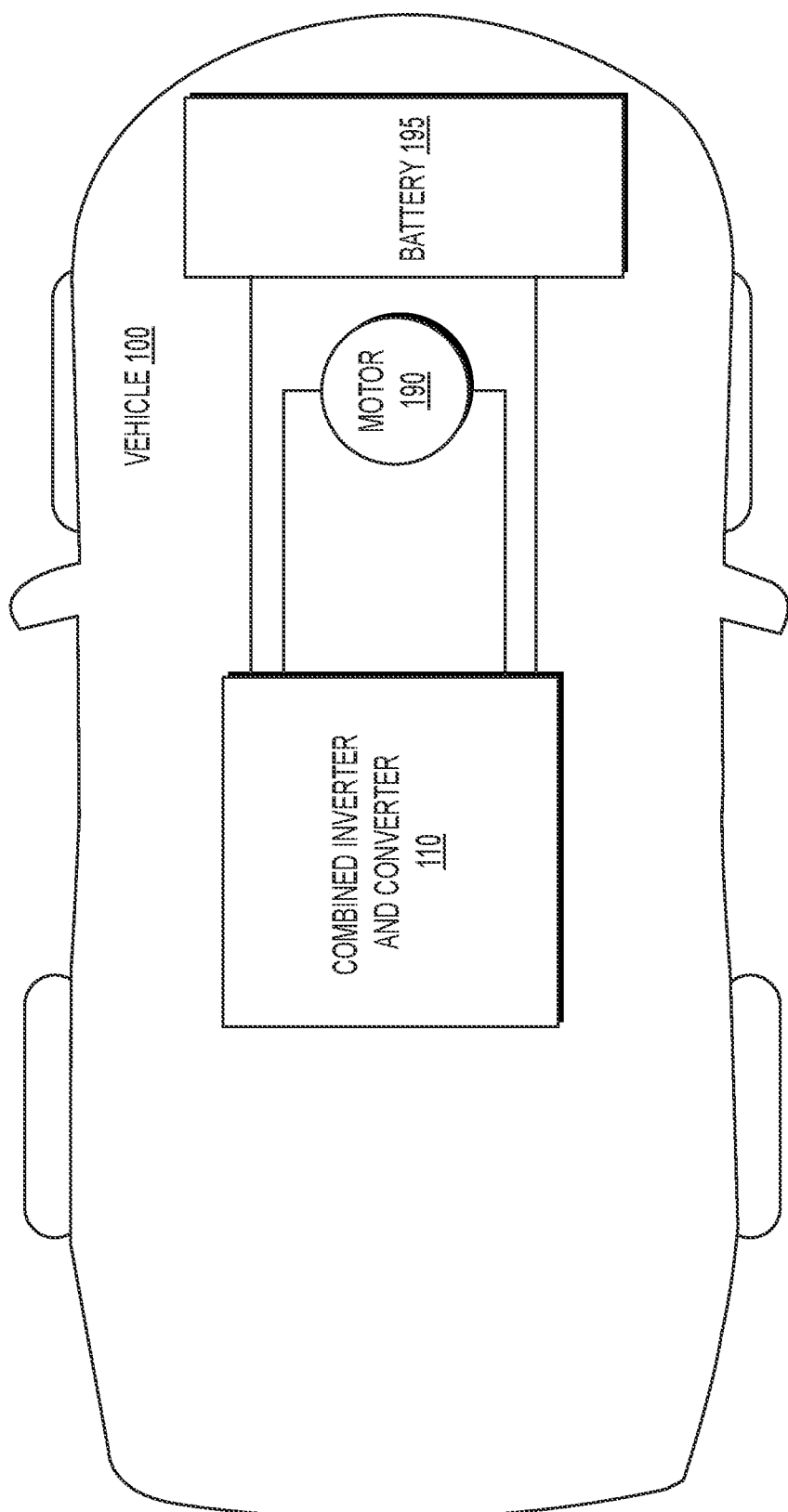
FIG. 1 depicts an exemplary system infrastructure for a vehicle including a combined inverter and converter, according to one or more embodiments.

Both the foregoing general description and the following detailed description are exemplary and explanatory only and are not restrictive of the features, as claimed. As used herein, the terms "comprises," "comprising," "has," "having," "includes," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, "about," "substantially," and "approximately" are used to indicate a possible variation of ±10% in the stated value. In this disclosure, unless stated otherwise, any numeric value may include a possible variation of ±10% in the stated value.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. For example, in the context of the disclosure, the switching devices may be described as switches or devices, but may refer to any device for controlling the flow of power in an electrical circuit. For example, switches may be metal-oxide-semiconductor field-effect transistors (MOSFETs), bipolar junction transistors (BJTs), insulated-gate bipolar transistors (IGBTs), or relays, for example, or any combination thereof, but are not limited thereto.

Various embodiments of the present disclosure relate generally to systems and methods for gate leakage detection for an inverter for an electric vehicle, and, more particularly, to systems and methods for monitoring gate leakage of a power device switch for an inverter for an electric vehicle.

Inverters, such as those used to drive a motor in an electric vehicle, for example, are responsible for converting High Voltage Direct Current (HVDC) into Alternating Current (AC) to drive the motor. A three phase inverter may include a bridge with six power device switches (for example, power transistors such as IGBT or MOSFET) that are controlled by Pulse Width Modulation (PWM) signals generated by a controller. An inverter may include three phase switches to control the phase voltage, upper and lower gate drivers to control the switches, a PWM controller, and glue logic between the PWM controller and the gate drivers. The PWM controller may generate signals to define the intended states of the system. The gate drivers may send the signals from the PWM controller to the phase switches. The phase switches may drive the phase voltage. The inverter may include an isolation barrier between low voltage and high voltage planes. Signals may pass from the PWM controller to the phase switches by passing across the isolation barrier, which may employ optical, transformer-based, or capacitance-based isolation. PWM signals may be distorted when passing through the glue logic, which may include resistive, capacitive, or other types of filtering. PWM signals may be distorted when passing through the gate driver, due to the galvanic isolation barrier and other delays within the gate driver. PWM signals may be distorted when the signals processed by the phase switch via the gate driver output.

Gate drivers may tolerate common-mode transients that occur during field-effect transistor (FET) switching and when one side of the floating high voltage terminal is shorted to ground or subject to an electro-static discharge. These voltage transients may result in fast edges, which may create bursts of common-mode current through the galvanic isolation. A gate driver may need to demonstrate common-mode transient immunity (CMTI) in order to be effective and safe.

Gate drivers may have a high-voltage domain in common to the voltage plane of an associated FET. Further, high-voltage planes may be supplied by a flyback converter that may be isolated through a transformer from the low-voltage plane. The high-voltage domain supply may be used to power circuits which source and sink gate current to drive the FET and which may detect FET faults so the faults can be acted upon and/or communicated to the low-voltage domain. Gate drivers may include a galvanic channel dedicated to FET commands, and one or more bidirectional or unidirectional galvanic channels dedicated to FET communications.

High current switching transients may create strong electro-magnetic (EM) fields that may couple into nearby metal traces. The magnitude and frequency of coupled currents may depend upon the layout of the FET packaging solution and the direction and length of metal traces between the FET and the control integrated circuit (IC). For example, typical values for coupled currents may be up to 1 A at AC frequencies up to 100 MHz. Typically, within a circuit, the gate driver IC may be placed far enough away from the FET that high EM fields do not couple directly into the internal metal traces within the gate driver IC. The gate driver is placed a distance from EM fields such that induced currents within the circuitry are below levels that will cause malfunction of the gate driver, or a metal shield is placed between the gate driver and the source of EM fields to protect the gate driver circuitry. The output terminals of the gate driver that connect to the FET are exposed to the EM fields at the point where the output terminals are no longer covered by a shield. The gate driver switches large currents (such as 5 A to 15 A, for example) through these exposed terminals. The switched large currents are generally greater in magnitude than the EM-induced currents. The gate driver is able to overdrive the induced currents to maintain control of the FETs. The high side of the gate drivers and the FET may share a common ground and a gate control signal trace, both of which may be susceptible to coupled currents.

Gate drivers may turn on low-resistance switches to source and sink gate currents. Series resistors may sometimes be added to limit gate current. Switched gate currents may be larger than coupled currents in order to maintain control of their respective FETs.

Gate drivers may be able to sense FET operating voltages or currents in order to provide feedback and react to faults. Over-current faults may typically be detected by sensing the FET drain to source voltage and comparing the sensed voltage to a reference value. Sensed voltages may be heavily filtered to reject coupled currents. Filtering may slow down the response to fault conditions, resulting in delays in response. For example, the rate of current increase due to a low resistance short circuit may reach damaging levels prior to being detected by the heavily filtered drain to source voltage detection strategy. The resulting short circuit may damage the FET or the vehicle, prior to being detected and shut off.

According to one or more embodiments, a FET driver circuit may provide rapid over-current detection by either shunt current sensing or by diverting a fraction of the load current through a parallel FET that may have a current sensing circuit. Utilizing either strategy may require a "point-of-use IC" where sensing circuitry is in close proximity to the FET. Even if a point-of-use IC and a remote controller are resistant to EM fields, communication between the point-of-use IC and remote controller remains susceptible to induced currents. Point-of-use ICs have been implemented in low EM field applications, such as smart FETs for automotive applications. However, point-of-use ICs have not been used in high EM field applications. A high EM field may be a field (i) that induces a current within an IC that is in excess of an operating current of the IC and leads to malfunction, or (ii) that induces a differential voltage within an IC which is in excess of the operating differential voltage and leads to malfunction. A high EM field may be a field that is greater than approximately 10 A or approximately 100V, for example.

As introduced above, gate leakage may be an important precursor to destructively cause failure in a power switch, such as a switch including a silicon carbide (SiC) die, for example, and may be an important health check indicator before power switch failure. An increase in gate leakage up to a certain point shows that a healthy device has been degraded to the point where destructive failure may occur. An increase in gate leakage current can occur either in a linear or non-linear manner and rapidly lead to device destruction. Gate leakage is typically very low, such as a few tens of nA, for example, in a healthy SiC device. The absolute value of gate leakage currents for a healthy device, and for a degraded device, are a function of the total gate area and the quality of gate dielectric for the MOSFET.

One or more embodiments may detect resistive trace shorts or high leakage paths between a point-of-use controller and a gate terminal of a power switch, such as a SiC.

Impact ionization and/or anode hole injection triggered by high oxide electric fields results in hole trapping that increases gate leakage current and reduces a threshold voltage of a device. With only electron trapping (under lower gate voltages), the gate leakage current continuously decreases. Ion implantation followed by high temperature anneal is normally utilized in SiC power MOSFETs fabrication. The ion implantation process creates damage in the SiC crystal and consequently affects the gate oxide reliability and ruggedness. The SiO2 layer grown on SiC has abundant extrinsic defects that may accelerate the degradation of the gate oxide and cause early failure. When gate drivers are used with SiC FETs, it becomes difficult to keep a track of gate leakage because the gate of the SiC FET is not accessible externally. By using an integrated circuit enclosed with the SiC FETs, it is possible to determine the gate leakage current accurately and keep the system updated regarding SiC and module health.

One or more embodiments may provide a non-invasive method for gate leakage detection that may be useful in determining the performance of SiC and module throughout their lifetime as well as during end of line testing. The gate leakage measurement may compensate for temperature and system level offset errors, which may improve the accuracy of the overall leakage measurement system. One or more embodiments may provide a system for gate leakage measurement, where an aged SiC device/module may be monitored precisely during life of the part and where leakage data may be stored in system memory.

FIG. 1 depicts an exemplary system infrastructure for a vehicle including a combined inverter and converter, according to one or more embodiments. In the context of this disclosure, the combined inverter and converter may be referred to as an inverter. As shown in FIG. 1, electric vehicle 100 may include an inverter 110, a motor 190, and a battery 195. The inverter 110 may include components to receive electrical power from an external source and output electrical power to charge battery 195 of electric vehicle 100. The inverter 110 may convert DC power from battery 195 in electric vehicle 100 to AC power, to drive motor 190 of the electric vehicle 100, for example, but the embodiments are not limited thereto. The inverter 110 may be bidirectional, and may convert DC power to AC power, or convert AC power to DC power, such as during regenerative braking, for example. Inverter 110 may be a three-phase inverter, a single-phase inverter, or a multi-phase inverter.

Figure 2:
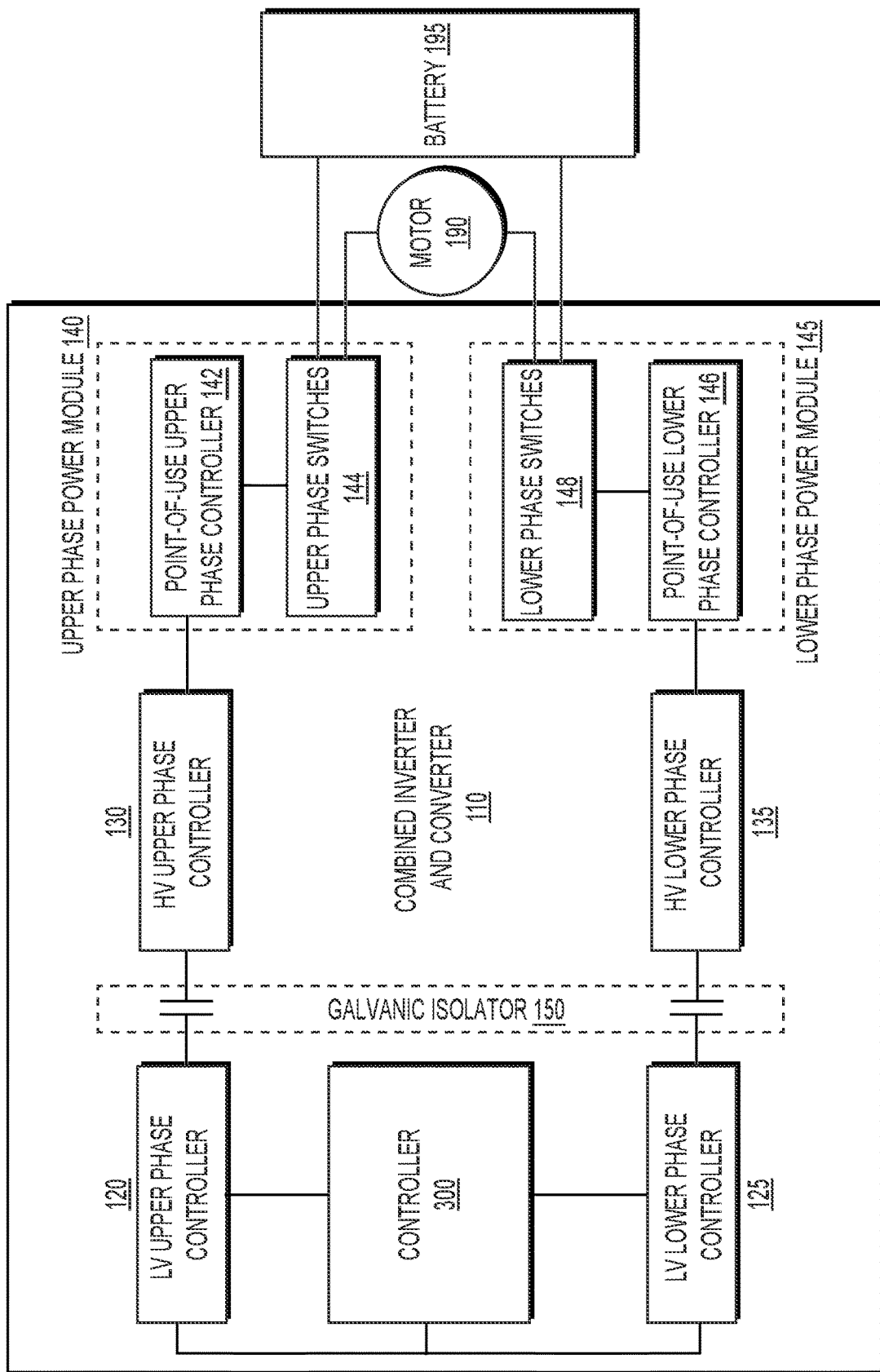
FIG. 2 depicts an exemplary system infrastructure for the combined inverter and converter of FIG. 1 with a point-of-use switch controller, according to one or more embodiments.

FIG. 2 depicts an exemplary system infrastructure for the inverter 110 of FIG. 1 with a point-of-use switch controller, according to one or more embodiments. Electric vehicle 100 may include inverter 110, motor 190, and battery 195. Inverter 110 may include an inverter controller 300 (shown in FIG. 3) to control the inverter 110. Inverter 110 may include a low voltage upper phase controller 120 separated from a high voltage upper phase controller 130 by a galvanic isolator 150, and an upper phase power module 140. Upper phase power module 140 may include a point-of-use upper phase controller 142 and upper phase switches 144. Inverter 110 may include a low voltage lower phase controller 125 separated from a high voltage lower phase controller 135 by galvanic isolator 150, and a lower phase power module 145. Lower phase power module 145 may include a point-of-use lower phase controller 146 and lower phase switches 148. Upper phase switches 144 and lower phase switches 148 may be connected to motor 190 and battery 195. Galvanic isolator 150 may be one or more of optical, transformer-based, or capacitance-based isolation. Galvanic isolator 150 may be one or more capacitors with a value from approximately 20 fF to approximately 100 fF, with a breakdown voltage from approximately 6 kV to approximately 12 kV, for example. Galvanic isolator 150 may include a pair of capacitors, where one capacitor of the pair carries an inverse data signal from the other capacitor of the pair to create a differential signal for common-mode noise rejection. Galvanic isolator 150 may include more than one capacitor in series. Galvanic isolator 150 may include one capacitor located on a first IC, or may include a first capacitor located on a first IC and a second capacitor located on a second IC that communicates with the first IC.

Inverter 110 may include a low voltage area, where voltages are generally less than 5V, for example, and a high voltage area, where voltages may exceed 500V, for example. The low voltage area may be separated from the high voltage area by galvanic isolator 150. Inverter controller 300 may be in the low voltage area of inverter 110, and may send signals to and receive signals from low voltage upper phase controller 120. Low voltage upper phase controller 120 may be in the low voltage area of inverter 110, and may send signals to and receive signals from high voltage upper phase controller 130. Low voltage upper phase controller 120 may send signals to and receive signals from low voltage lower phase controller 125. High voltage upper phase controller 130 may be in the high voltage area of inverter 110. Accordingly, signals between low voltage upper phase controller 120 and high voltage upper phase controller 130 pass through galvanic isolator 150. High voltage upper phase controller 130 may send signals to and receive signals from point-of-use upper phase controller 142 in upper phase power module 140. Point-of-use upper phase controller 142 may send signals to and receive signals from upper phase switches 144. Upper phase switches 144 may be connected to motor 190 and battery 195. Upper phase switches 144 and lower phase switches 148 may be used to transfer energy from motor 190 to battery 195, from battery 195 to motor 190, from an external source to battery 195, or from battery 195 to an external source, for example. The lower phase system of inverter 110 may be similar to the upper phase system as described above.

Figure 3:
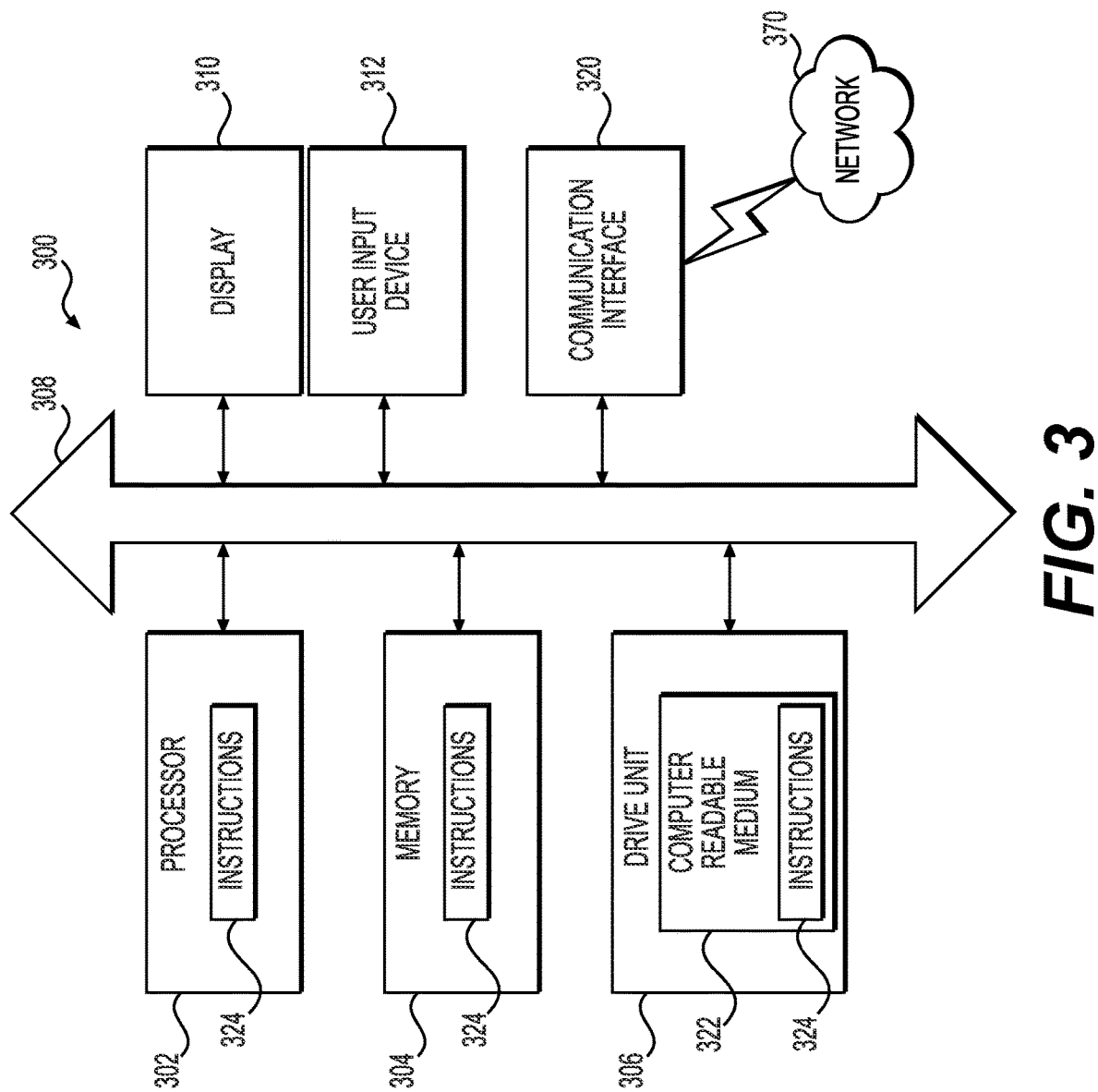
FIG. 3 depicts an exemplary system infrastructure for the controller of FIG. 2, according to one or more embodiments.

FIG. 3 depicts an exemplary system infrastructure for inverter controller 300 of FIG. 2, according to one or more embodiments. Inverter controller 300 may include one or more controllers.

The inverter controller 300 may include a set of instructions that can be executed to cause the inverter controller 300 to perform any one or more of the methods or computer based functions disclosed herein. The inverter controller 300 may operate as a standalone device or may be connected, e.g., using a network, to other computer systems or peripheral devices.

In a networked deployment, the inverter controller 300 may operate in the capacity of a server or as a client in a server-client user network environment, or as a peer computer system in a peer-to-peer (or distributed) network environment. The inverter controller 300 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular implementation, the inverter controller 300 can be implemented using electronic devices that provide voice, video, or data communication. Further, while the inverter controller 300 is illustrated as a single system, the term "system" shall also be taken to include any collection of systems or sub-systems that individually or jointly execute a set, or multiple sets, of instructions to perform one or more computer functions.

As shown in FIG. 3, the inverter controller 300 may include a processor 302, e.g., a central processing unit (CPU), a graphics processing unit (GPU), or both. The processor 302 may be a component in a variety of systems. For example, the processor 302 may be part of a standard inverter. The processor 302 may be one or more general processors, digital signal processors, application specific integrated circuits, field programmable gate arrays, servers, networks, digital circuits, analog circuits, combinations thereof, or other now known or later developed devices for analyzing and processing data. The processor 302 may implement a software program, such as code generated manually (i.e., programmed).

The inverter controller 300 may include a memory 304 that can communicate via a bus 308. The memory 304 may be a main memory, a static memory, or a dynamic memory. The memory 304 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one implementation, the memory 304 includes a cache or random-access memory for the processor 302. In alternative implementations, the memory 304 is separate from the processor 302, such as a cache memory of a processor, the system memory, or other memory. The memory 304 may be an external storage device or database for storing data. Examples include a hard drive, compact disc ("CD"), digital video disc ("DVD"), memory card, memory stick, floppy disc, universal serial bus ("USB") memory device, or any other device operative to store data. The memory 304 is operable to store instructions executable by the processor 302. The functions, acts or tasks illustrated in the figures or described herein may be performed by the processor 302 executing the instructions stored in the memory 304. The functions, acts or tasks are independent of the particular type of instructions set, storage media, processor or processing strategy and may be performed by software, hardware, integrated circuits, firm-ware, micro-code and the like, operating alone or in combination. Likewise, processing strategies may include multiprocessing, multitasking, parallel processing and the like.

As shown, the inverter controller 300 may further include a display 310, such as a liquid crystal display (LCD), an organic light emitting diode (OLED), a flat panel display, a solid-state display, a cathode ray tube (CRT), a projector, a printer or other now known or later developed display device for outputting determined information. The display 310 may act as an interface for the user to see the functioning of the processor 302, or specifically as an interface with the software stored in the memory 304 or in the drive unit 306.

Additionally or alternatively, the inverter controller 300 may include an input device 312 configured to allow a user to interact with any of the components of inverter controller 300. The input device 312 may be a number pad, a keyboard, or a cursor control device, such as a mouse, or a joystick, touch screen display, remote control, or any other device operative to interact with the inverter controller 300.

The inverter controller 300 may also or alternatively include drive unit 306 implemented as a disk or optical drive. The drive unit 306 may include a computer-readable medium 322 in which one or more sets of instructions 324, e.g. software, can be embedded. Further, the instructions 324 may embody one or more of the methods or logic as described herein. The instructions 324 may reside completely or partially within the memory 304 and/or within the processor 302 during execution by the inverter controller 300. The memory 304 and the processor 302 also may include computer-readable media as discussed above.

In some systems, a computer-readable medium 322 includes instructions 324 or receives and executes instructions 324 responsive to a propagated signal so that a device connected to a network 370 can communicate voice, video, audio, images, or any other data over the network 370. Further, the instructions 324 may be transmitted or received over the network 370 via a communication port or interface 320, and/or using a bus 308. The communication port or interface 320 may be a part of the processor 302 or may be a separate component. The communication port or interface 320 may be created in software or may be a physical connection in hardware. The communication port or interface 320 may be configured to connect with a network 370, external media, the display 310, or any other components in inverter controller 300, or combinations thereof. The connection with the network 370 may be a physical connection, such as a wired Ethernet connection or may be established wirelessly as discussed below. Likewise, the additional connections with other components of the inverter controller 300 may be physical connections or may be established wirelessly. The network 370 may alternatively be directly connected to a bus 308.

While the computer-readable medium 322 is shown to be a single medium, the term "computer-readable medium" may include a single medium or multiple media, such as a centralized or distributed database, and/or associated caches and servers that store one or more sets of instructions. The term "computer-readable medium" may also include any medium that is capable of storing, encoding, or carrying a set of instructions for execution by a processor or that cause a computer system to perform any one or more of the methods or operations disclosed herein. The computer-readable medium 322 may be non-transitory, and may be tangible.

The computer-readable medium 322 can include a solid-state memory such as a memory card or other package that houses one or more non-volatile read-only memories. The computer-readable medium 322 can be a random-access memory or other volatile re-writable memory. Additionally or alternatively, the computer-readable medium 322 can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative implementation, dedicated hardware implementations, such as application specific integrated circuits, programmable logic arrays and other hardware devices, can be constructed to implement one or more of the methods described herein. Applications that may include the apparatus and systems of various implementations can broadly include a variety of electronic and computer systems. One or more implementations described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The inverter controller 300 may be connected to a network 370. The network 370 may define one or more networks including wired or wireless networks. The wireless network may be a cellular telephone network, an 802.11, 802.16, 802.20, or WiMAX network. Further, such networks may include a public network, such as the Internet, a private network, such as an intranet, or combinations thereof, and may utilize a variety of networking protocols now available or later developed including, but not limited to TCP/IP based networking protocols. The network 370 may include wide area networks (WAN), such as the Internet, local area networks (LAN), campus area networks, metropolitan area networks, a direct connection such as through a Universal Serial Bus (USB) port, or any other networks that may allow for data communication. The network 370 may be configured to couple one computing device to another computing device to enable communication of data between the devices. The network 370 may generally be enabled to employ any form of machine-readable media for communicating information from one device to another. The network 370 may include communication methods by which information may travel between computing devices. The network 370 may be divided into sub-networks. The sub-networks may allow access to all of the other components connected thereto or the sub-networks may restrict access between the components. The network 370 may be regarded as a public or private network connection and may include, for example, a virtual private network or an encryption or other security mechanism employed over the public Internet, or the like.

In accordance with various implementations of the present disclosure, the methods described herein may be implemented by software programs executable by a computer system. Further, in an exemplary, non-limited implementation, implementations can include distributed processing, component or object distributed processing, and parallel processing. Alternatively, virtual computer system processing can be constructed to implement one or more of the methods or functionality as described herein.

Although the present specification describes components and functions that may be implemented in particular implementations with reference to particular standards and protocols, the disclosure is not limited to such standards and protocols. For example, standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

It will be understood that the operations of methods discussed are performed in one embodiment by an appropriate processor (or processors) of a processing (i.e., computer) system executing instructions (computer-readable code) stored in storage. It will also be understood that the disclosure is not limited to any particular implementation or programming technique and that the disclosure may be implemented using any appropriate techniques for implementing the functionality described herein. The disclosure is not limited to any particular programming language or operating system.

Figure 4:
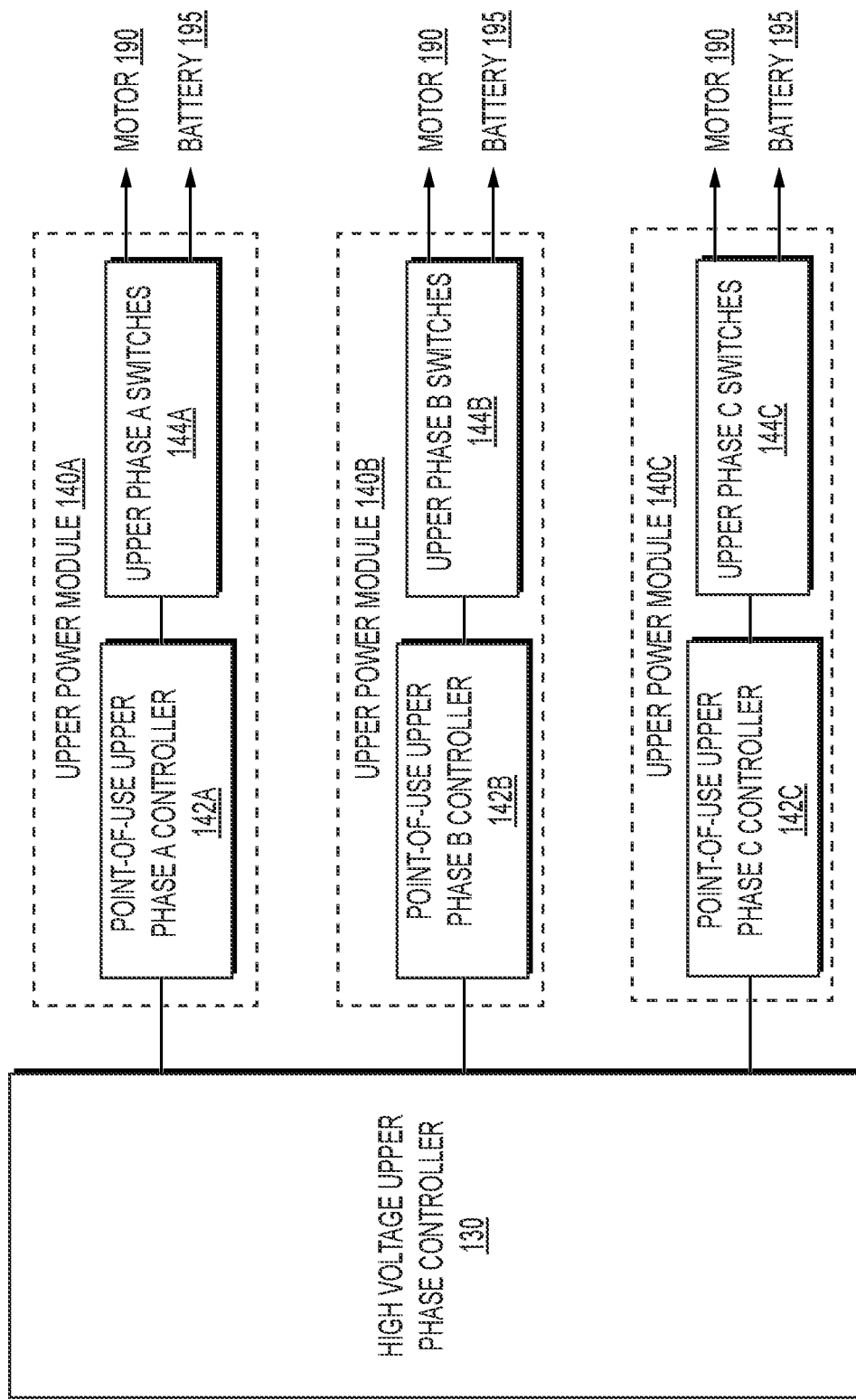
FIG. 4 depicts an exemplary system infrastructure for the point-of-use switch controller of FIG. 2, according to one or more embodiments.

FIG. 4 depicts an exemplary system infrastructure for the point-of-use switch controller of FIG. 2, according to one or more embodiments. For a three-phase inverter, each of the upper phase and the lower phase may include three phases correlating with phases A, B, and C. For example, upper phase power module 140 may include upper phase power module 140A for upper phase A, upper phase power module 140B for upper phase B, and upper phase power module 140C for upper phase C. Upper phase power module 140A may include point-of-use upper phase A controller 142A and upper phase A switches 144A. Upper phase power module 140B may include point-of-use upper phase B controller 142B and upper phase B switches 144B. Upper phase power module 140C may include point-of-use upper phase C controller 142C and upper phase C switches 144C. Each of the upper phase A switches 144A, upper phase B switches 144B, and upper phase C switches 144C may be connected to motor 190 and battery 195. FIG. 4 depicts details of the upper phase power module 140. Although not shown, the lower phase power module 145 may include a similar structure as the upper phase power module 140 for lower phases A, B, and C.

Figure 5:
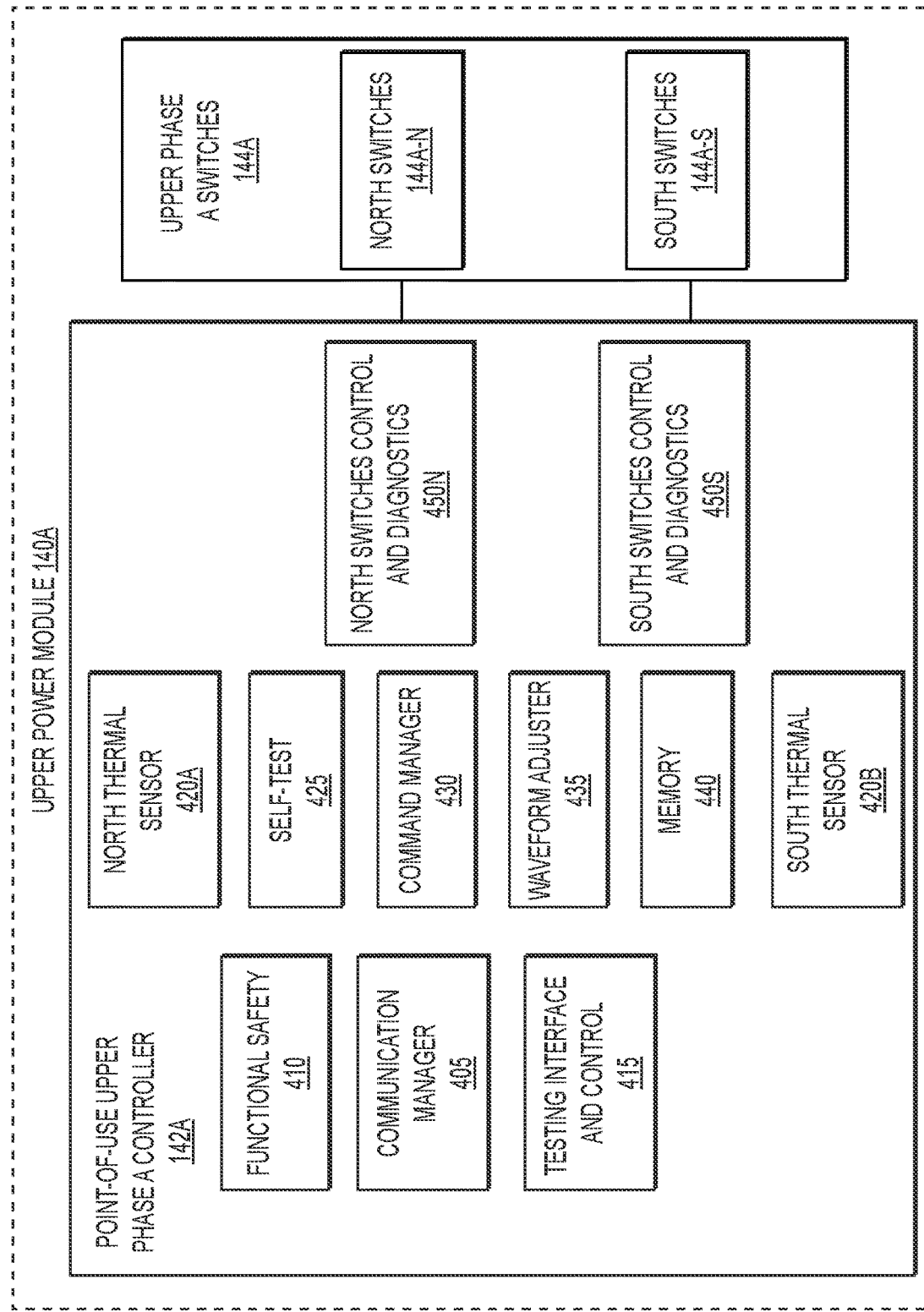
FIG. 5 depicts an exemplary system infrastructure for the upper power module of FIG. 4, according to one or more embodiments.

FIG. 5 depicts an exemplary system infrastructure for the upper power module of FIG. 4, according to one or more embodiments. For example, FIG. 5 provides additional details of upper phase power module 140A. Although not shown, upper phase power module 140B, upper phase power module 140C, and respective lower phase power modules of lower phase power module 145 may include a similar structure as the upper phase power module 140A shown in FIG. 5. Moreover, the terms upper, lower, north, and south used in the disclosure are merely for reference, do not limit the elements to a particular orientation, and are generally interchangeable throughout. For example, the upper phase power module 140 could be referred to a lower phase power module, a north phase power module, a south phase power module, a first phase power module, or a second phase power module.

Upper phase power module 140A may include point-of-use upper phase A controller 142A and upper phase A switches 144A. Upper phase A switches 144A may include one or more groups of switches. As shown in FIG. 5, upper phase A switches 144A may include upper phase A north switches 144A-N and upper phase A south switches 144A-S. Point-of-use upper phase A controller 142A may include one or more memories, controllers, or sensors. For example, point-of-use upper phase A controller 142A may include a communication manager 405, a functional safety controller 410, a testing interface and controller 415, a north thermal sensor 420A, a south thermal sensor 420B, a self-test controller 425, a command manager 430, a waveform adjuster 435, a memory 440, north switches control and diagnostics controller 450N, and south switches control and diagnostics controller 450S. Point-of-use upper phase A controller 142A may include more or less components than those shown in FIG. 5. For example, point-of-use upper phase A controller 142A may include more or less than two switch control and diagnostics controllers, and may include more than two thermal sensors.

Communication manager 405 may control inter-controller communications to and from point-of-use upper phase A controller 142A and/or may control intra-controller communications between components of point-of-use upper phase A controller 142A. Functional safety controller 410 may control safety functions of point-of-use upper phase A controller 142A. Testing interface and controller 415 may control testing functions of point-of-use upper phase A controller 142A, such as end-of-line testing in manufacturing, for example. North thermal sensor 420A may sense a temperature at a first location in point-of-use upper phase A controller 142A, and south thermal sensor 420B may sense a temperature at a second location in point-of-use upper phase A controller 142A. Self-test controller 425 may control a self-test function of point-of-use upper phase A controller 142A, such as during an initialization of the point-of-use upper phase A controller 142A following a power on event of inverter 110, for example. Command manager 430 may control commands received from communication manager 405 issued to the north switches control and diagnostics controller 450N and south switches control and diagnostics controller 450S. Waveform adjuster 435 may control a waveform timing and shape of commands received from communication manager 405 issued to the north switches control and diagnostics controller 450N and south switches control and diagnostics controller 450S. Memory 440 may include one or more volatile and non-volatile storage media for operation of point-of-use upper phase A controller 142A. North switches control and diagnostics controller 450N may send one or more signals to north switches 144A-N to control an operation of north switches 144A-N, and may receive one or more signals from north switches 144A-N that provide information about north switches 144A-N. South switches control and diagnostics controller 450S may send one or more signals to south switches 144A-S to control an operation of south switches 144A-S, and may receive one or more signals from south switches 144A-S that provide information about south switches 144A-S. As stated above, the terms north and south are merely used for reference, and north switches control and diagnostics controller 450N may send one or more signals to south switches 144A-S, and south switches control and diagnostics controller 450S may send one or more signals to south switches 144A-N.

Figure 6:
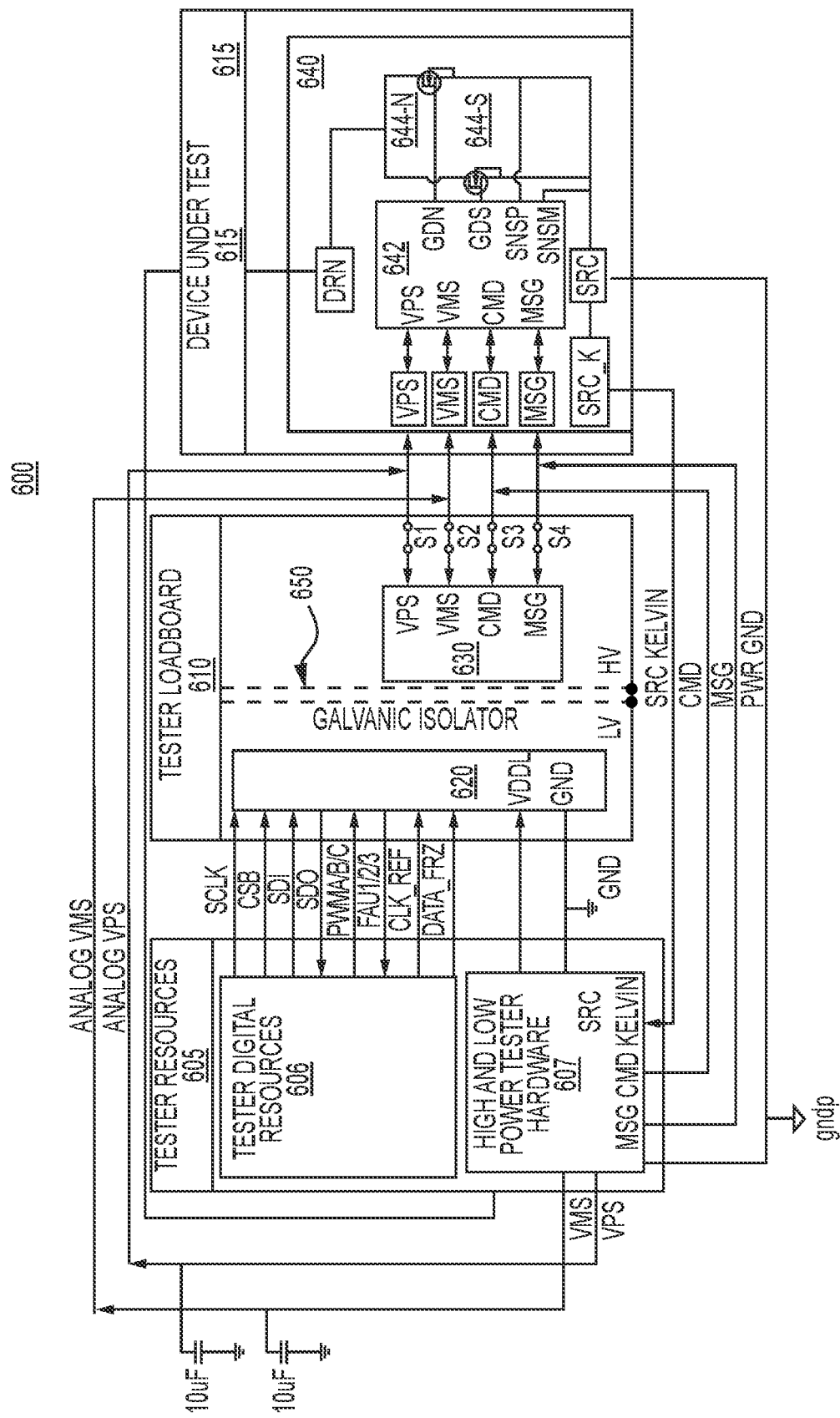
FIG. 6 depicts an exemplary line test system for detecting gate leakage of a power device switch, according to one or more embodiments.

FIG. 6 depicts an exemplary line test system for detecting gate leakage of a power device switch, according to one or more embodiments.

Gate to source leakage is an important precursor to destructively cause failure in a power switch, such as a SiC, for example, and may provide a health check indicator before power switch failure. Increases in gate to source leakage by a factor of 5 to 10 shows that a healthy device has been compromised, and may lead to system failure. Gate to source leakage is typically very low, such as a few nA, for example, in a healthy power switch device. Possible root causes for increased gate to source leakage includes impact ionization and/or anode hole injection triggered by high oxide electric fields, which results in hole trapping that increases gate leakage current and reduces device gate to source threshold voltage. With only electron trapping (under lower gate voltages), the gate leakage current continuously decreases. An increase in gate to source leakage current can occur in a nonlinear manner and rapidly lead to device destruction.

Ion implantation followed by high temperature anneal is normally utilized in fabrication of a SiC power MOSFET. The ion implantation process creates damage in the SiC crystal and consequently affects the gate oxide reliability and ruggedness. The SiO2 layer grown on SiC has abundant extrinsic defects that may accelerate the degradation of the gate oxide and cause early failure.

To avoid the potential for catastrophic failure, any increase in gate to source leakage should be prevented or detected. Prevention of gate to source leakage increase requires the ability to detect and record gate to source leakage current, within an operating system, to determine the root cause. Having determined the root cause, changes to the design and operation of the system into which the MOSFET operates will then be required, followed by re-measurement of gate to source leakage to verify that the design and operational changes have led to the desired result. After implementing prevention measures, a system for detecting gate to source leakage current should monitor the device.

An increase in the gate to source leakage of a power switch may lead to failure of the device or may decrease an efficiency of the system. Therefore, it may be necessary to measure gate leakage current under various operating conditions. When SiC FETs are driven with integrated gate drivers, it may be difficult to measure gate to source leakage because the gate of the SiC FET is not externally accessible. By using an additional circuit block within the integrated gate driver enclosed with a SiC FET, it may be possible to determine the gate leakage current accurately and monitor the health of the device.

One or more embodiments may provide a non-invasive method for gate leakage detection, which may be useful in determining the performance of SiC and module throughout their lifetime, as well as during end of line testing. One or more embodiments may provide a gate leakage measurement that compensates for temperature and system level offset errors. This compensation may improve the accuracy of the overall leakage measurement system. One or more embodiments may provide a method of gate leakage measurement where an aged SiC device or module may be monitored precisely during life of the part, and where leakage data may be stored in system memory.

A SiC FET may be assembled inside a product package. For example, as shown in FIG. 6, a point-of-use controller 642 may be packaged in power module 640 along with north power switch 644-N and south power switch 644-S. The point-of-use controller 642 may drive north power switch 644-N and south power switch 644-S, and may include an embedded gate leakage measurement circuit (see FIG. 7). Point-of-use controller 642 may be an implementation of point-of-use upper phase controller 142, for example. Power module 640 may be an implementation of upper phase power module 140, for example. North power switch 644-N and south power switch 644-S may be an implementation of upper phase A north switches 144A-N and upper phase A south switches 144A-S, for example.

As shown in FIG. 6, the drain (DRN) and source (SRC) of north power switch 644-N and south power switch 644-S may be externally accessible through tester equipment. Respective gates of north power switch 644-N and south power switch 644-S may only accessible through point-of-use controller 642, and not externally accessible (outside power module 640). VPS and VMS may be positive and negative supply voltages for the power module 640. The tester may communicate with north power switch 644-N and south power switch 644-S through point-of-use controller 642 using SPI communication, using the CMD and/or MSG lines, for example.

As shown in FIG. 6, a testing system 600 may include a tester resources 605, a tester loadboard 610, and a device under test 615. Testing system 600 may be an end-of-line testing station for individual components of inverter 110. In an inverter 110, for example, the tester resources 605 may include inverter controller 300, and may communicate with low voltage upper phase controller 120 and high voltage upper phase controller 130, for example. As shown in FIG. 5, in inverter 110, the components above may communicate with testing interface and controller 415 of point-of-use upper phase controller 142 of upper phase power module 140, for example.

Tester resources 605 may include tester digital resources 606 and tester hardware 607. Tester loadboard 610 may include low voltage controller 620, high voltage controller 630, and galvanic isolator 650. As shown in FIG. 6, tester digital resources 606 may interface with low voltage controller 620. Tester hardware 607 may provide VPS and VMS power to device under test 615, and may interface with power module 640 using the CMD and/or MSG lines. Tester resources 605 may include SRC and DRN connections to device under test 615 and power module 640. High voltage controller 630 may interface with device under test 615 and power module 640.

One or more embodiments may provide a leakage measurement method that may measure the gate leakage of north power switch 644-N and south power switch 644-S, without having access to gate terminals externally to the power module 640. Power module 640 may be designed with point-of-use controller 642 inside the power module 640, and point-of-use controller 642 has access to the gate terminal. One or more embodiments may provide a resolution of leakage current measurement of approximately 50 nA, which may be ten times better than leakage current measurement resolution with an isolated gate driver. One or more embodiments may provide a leakage measurement method that operates from −40 C to 165 C. One or more embodiments may detect the gate leakage during mission mode operation of the power module 640. One or more embodiments may provide a gate leakage detection system that is designed for temperature and offset compensation. One or more embodiments may provide a gate leakage detection system that determines an amount of leakage current.

Figure 7:
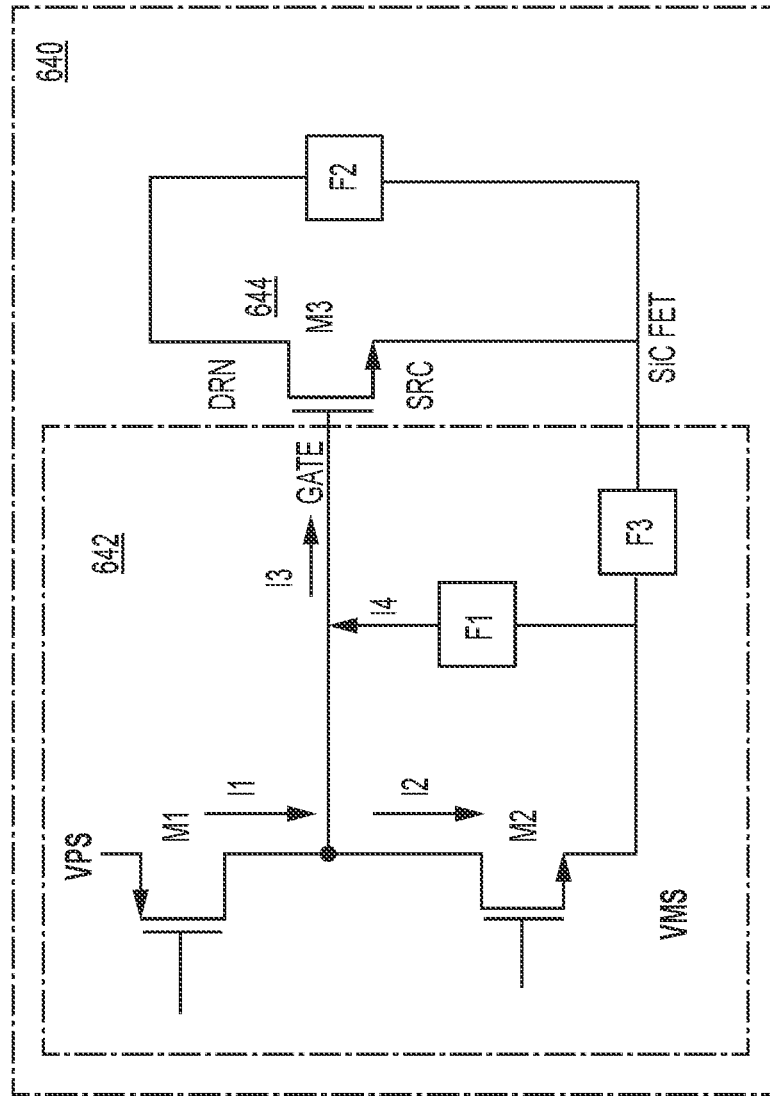
FIG. 7 depicts an exemplary point-of-use test system for detecting gate leakage of a power device switch, according to one or more embodiments.

FIG. 7 depicts an exemplary point-of-use test system for detecting gate leakage of a power device switch, according to one or more embodiments.

As shown in FIG. 7, a power module 640 may include power switch 644 (M3) and point-of-use controller 642. Power switch 644 may include one or more of north power switch 644-N or south power switch 644-S, for example. The point-of-use controller 642 may be measured as a stand-alone module prior to being added to the power module 640, and the point-of-use controller 642 can be used to measure aspects of the power module 640 after the point-of-use controller 642 has been added to the power module 640. One or more embodiments may provide a system that makes use of these two separate capabilities.

The gate leakage current which is present in the point-of-use controller 642 may be measured prior to adding the point-of-use controller 642 to the power module 640. The measurement result may be stored in non-volatile memory within the point-of-use controller 642. The point-of-use controller 642 may then be added to the power module 640. The gate leakage current of both the point-of-use controller 642 and power switch 644 may be measured. The measured value may be stored in non-volatile memory within the point-of-use controller 642.

A calculation may be performed whereby the gate leakage current which is present in the point-of-use controller 642 is subtracted from the gate leakage current of both the point-of-use controller 642 and power switch 644 to determine the gate leakage current of the power switch 644. One or more embodiments may ensure that leakage detection is free from system or circuit level offsets and compensates for temperature.

This non-invasive method for gate leakage detection may be useful in determining the performance of power switch 644 and power module 640 throughout their lifetime as well as during end of line testing. Also, a gate leakage detection may be performed for every power up cycle for power module 640. Consequently, gate leakage current may be detected during mission mode.

One or more embodiments may determine the direction of gate leakage current, either positive or negative. One or more embodiments may provide gate leakage current detection accuracy of less than 50 nA. One or more embodiments may store leakage data in system memory, which may be used by the inverter 110 periodically to assess the health of power switch 644 and the efficiency of inverter 110. The range of leakage current detection may be changed by changing a gain of the system or by using advanced offset correction methods as described below.

FIG. 8 depicts an exemplary procedure 800 for operating the point-of-use test system of FIG. 7, according to one or more embodiments. As shown in FIGS. 7, F1, F2, and F3 may be instruments that can force voltage and measure current. For example, F2 may be an instrument that is part of test equipment, and F1 and F3 may be circuits with the integrated gate driver that are able to force voltage and measure leakage current.

In operation 802, M1 and M2 may be in an off-state and have a characteristic leakage, such as less than 1 μA, for example. In operation 804, F1 and F3 may be set to V1, where V1 is a specified test voltage. The gate-to-source voltage of power switch 644 may be 0V because F1 is equal to F3. In operation 806, F2 may be set to 0V, leading to a drain-to-source voltage of power switch 644 of 0V. In operation 808, the gate current (I3) of power switch 644 is equal to 0 because the gate-to-source voltage and drain-to-source voltage of power switch 644 is 0V. In operation 810, F1 measures the current I4(1) at the test voltage V1. I4(1) is equal to I3+I2−I1, where the gate current (I3) of power switch 644 is equal to 0 A, so that I4(1) is equal to I2−I1.

In operation 812, M1 and M2 may be in the off-state and have a characteristic leakage. In operation 814, F1 is set to V1, where V1 is the specified test voltage set in operation 802, and F3 is set to 1V, and gate-to-source voltage of power switch 644 is equal to V1. In operation 816, F2 may be set to 0V, leading to a drain-to-source voltage of power switch 644 of 0V. In operation 818, the gate current (I3) of power switch 644 may not be equal to 0 A because the gate-to-source voltage of power switch 644 is equal to V1. In operation 820, F1 measures the current I4(2) at the test voltage V1. I4(2)=I3+I2−I1.

In operation 822, the power switch 644 gate leakage current at a specified gate-to-source voltage equal to V1 is equal to I4(2)−I4(1). Operations 810-822 may be repeated for different specified test voltages (V1) as needed.

Point-of-use controller 642 controls the gate of power switch 644. Hence, to measure the gate current leakage of power switch 644, it may be necessary to calculate leakage of point-of-use controller 642. The output stage of point-of-use controller 642 may include large PMOS and NMOS devices. The PMOS and NMOS devices may be used to drive the gate terminal(s) of the SiC power device(s) to VPS (on-voltage) and VMS (off-voltage), respectively. VPS and VMS may be supply voltages for the point-of-use controller 642, and the output of point-of-use controller 642 is connected to the gate of power switch 644.

The gate to source leakage test may be performed at a gate to source voltage generated by a power switch gate leakage detector of point-of-use controller 642. By properly selecting positive and negative supply voltages for power module 640, a necessary gate voltage may be generated for the gate of power switch 644.

Because the gate of power switch 644 is always connected to point-of-use controller 642, procedure 800 may determine a leakage for point-of-use controller 642 while reducing any possible error leakage current from other leakage contributing devices connected to the gate of power switch 644, and ideally to a 0 value. Also, the drain and source terminals may be grounded so that a drain to source voltage of power switch 644 is 0V. The gate leakage detector inside point-of-use controller 642 may use internal circuitry to find a leakage of point-of-use controller 642 and save this value, while ensuring a gate to source voltage of power switch 644 is 0V. This 0V gate to source voltage of power switch 644 may be generated by gate leakage detector inside point-of-use controller 642.

Next, a gate to source voltage may be applied to the gate of power switch 644 using gate leakage detector inside point-of-use controller 642. By adjusting values of VPS and VMS power supplies, an intended gate voltage may be generated. Now, power switch 644 gate leakage as well as drain to source leakage for point-of-use controller 642 is measured and stored in a memory of point-of-use controller 642.

Therefore, gate leakage of power switch 644 is leakage for the point-of-use controller 642 subtracted from leakage for the point-of-use controller 642 and power switch 644. This gate leakage of power switch 644 may be either a positive or negative number, depending upon the direction of the leakage current.

Also, during the current measurements, the drain to source voltage across driver module output should remain constant, such as 0.5*(VPS−VMS), for example. This ensures that proper leakage measurement is performed, and may be performed by correctly selecting VPS and VMS values. Procedure 800 may be performed to measure a gate leakage of power switch 644 during end of line product testing. Procedure 800 may be performed at various temperatures.

Figure 9:
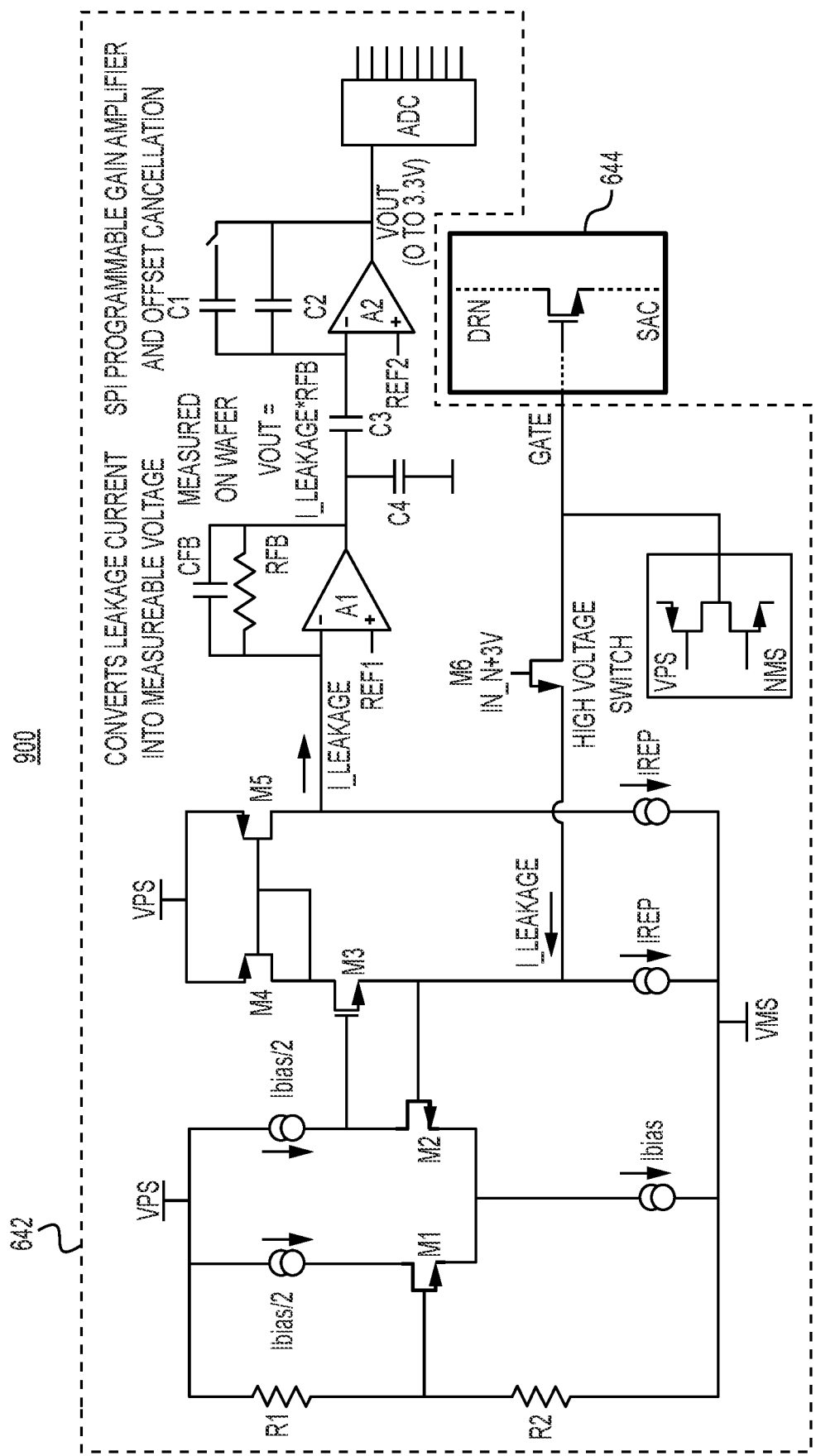
FIG. 9 depicts an exemplary gate leakage detector for detecting gate leakage of a power device switch, according to one or more embodiments.

FIG. 9 depicts an exemplary gate leakage detector 900 for detecting gate leakage of a power device switch, according to one or more embodiments. Gate leakage detector 900 may be a component of point-of-use controller 642, for example, and may include a current to voltage converter, a switched capacitor amplifier circuit, and a resistor divider bank to create a necessary reference gate voltage.

As shown in FIG. 9, transistors M1 to M5 may form a differential cascade amplifier and current source circuit. The R1 and R2 resistors may generate a gate voltage based on supply values VPS and VMS. The other input of the differential amplifier may be connected to a gate of power switch 644 through a MOSFET switch M6. The gate of power switch 644 may also be connected to an output of point-of-use controller 642 as also shown in FIG. 7, for example. The transistors M4 and M5 may be current sources and biased with IREF. Differential pair M1 and M2 may be biased with Ibias current.

Amplifier A1 may form the current to voltage converter, and RFB feedback resistor may define the voltage at the output of the amplifier A1. Amplifier A2 may form the switched capacitor amplifier circuit that boosts the output of A1 by adjusting a gain value. A2 may provide adequate signal strength if the leakage current is too small. By adjusting an offset of A2, the output voltage may be controlled to half supply range if the signal is too large or too small. The output voltage of amplifier A2 may be fed to ADC, and the output of the ADC may provide a gate leakage value.

Gate leakage detector 900 may include a DC portion that sets the gate voltage for power switch 644, and an AC portion, the switched capacitor amplifier circuit, which may maintain the output voltage level. A gate voltage of M1 may be set by R1 and R2 resistor divider and (VPS−VMS) voltage supply. Due to negative feedback, the gate of M2 may be at a same level as M1. The gate of M2 may be connected to the gate terminal of power switch 644 through switch M6. M6 may be switched at a sampling frequency.

When M6 is in an ON state, a leakage current flows through M3, M4, and M5. Because M4 and M5 are biased with constant current IREF, the leakage current flows through the lowest resistance path, which is through feedback resistor RFB. A proportional voltage is created across feedback resistor RFB, and this voltage is amplified by switched cap amplifier circuits A1 and A2 with gain and offset settings.

If the current through M3 is disrupted, for example, if the current goes high, then a gate of M2 is pulled up and a gate to source voltage of M2 increases. Due to the increased gate to source voltage of M2, the drain of M2 is pulled down. Because the drain of M2 is connected to the gate of M3, the M3 gate is pulled down, which lowers the gate to source voltage of M3 and the current in M3 is always the sum of IREF and I_LEAKAGE. The gate of M2 and M1 remains at a constant voltage set by resistor R1 and R2.

The range of leakage current is controlled by a value of feedback resistor RFB and a voltage across feedback resistor RFB. Specifically, Ileakage=RFB voltage/RFB resistor value. To consider positive and negative leakage current, half supply is a maximum voltage across RFB, which may be approximately 1.65V, for example. For a +/−5 µA leakage current, RFB=1.65/5 µA, or 330 kOhm.

The output voltage of amplifier A1 may be fed to a switched capacitor circuit A2 that has a gain and offset setting. If the leakage current is too low, then a gain of amplifier A2 may be increased to get better signal strength. The output of A2 may be fed to ADC to read the leakage current. The leakage current may be determined by:

$$I\_Leakage=[(C1)/(C3*RFB)]*[Vout-(VCCL-VMS)/3+(REF2+VMS)].$$

Figure 10:
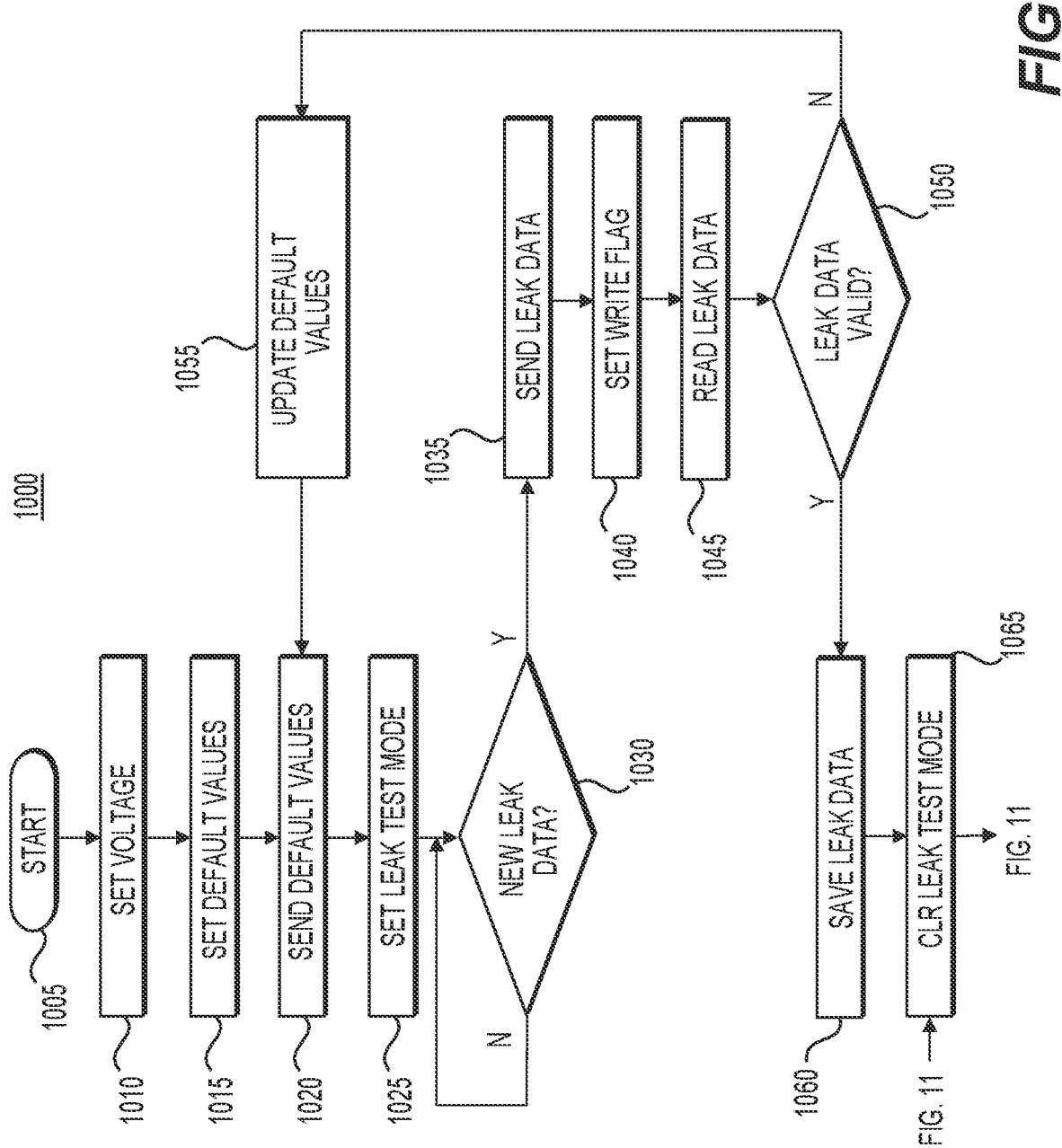
FIG. 10 depicts an exemplary procedure for detecting gate leakage of a point-of-use controller for a power device switch, according to one or more embodiments.

FIG. 10 depicts an exemplary procedure 1000 for detecting gate leakage of a point-of-use controller for a power device switch, according to one or more embodiments.

Procedure 1000 for detecting gate leakage of a point-of-use controller (e.g. point-of-use controller 642) for a power device switch (e.g. point-of-use upper phase controller 142) may begin at operation 1005. At operation 1010, the tester resources 605 may set VPS and VMS to a proper voltage. At operation 1015, the tester resources 605 may write, via SPI, for example, default values into a low voltage controller, such as low voltage upper phase controller 120, for example. The default values may include values for a delay register, a count register, a gain register, an offset register, and an address register, for example.

At operation 1020, the point-of-use controller may receive the default values. At operation 1025, the tester resources 605 may set the mode of the low voltage controller and the point-of-use controller to detect a gate leakage of the point-of-use controller. The point-of-use controller may perform the leakage operation as described in FIG. 8, for example. At operation 1030, the point-of-use controller may check whether point-of-use controller leakage data is available from the ADC of the point-of-use controller. At operation 1035, when the point-of-use controller leakage data is available, the point-of-use controller may transmit the point-of-use controller leakage data to the low voltage controller.

At operation 1040, the low voltage controller may set a notification to the tester resources 605 that point-of-use controller leakage data is available. At operation 1045, the tester resources 605 may read the point-of-use controller leakage data and clear the notification. At operation 1050, the tester resources 605 may verify that the point-of-use controller leakage data is within a usable range. At operation 1055, if the point-of-use controller leakage data is not within a usable range, the tester resources 605 may update the default values, and proceed to operation 1020 above. At operation 1060, if the point-of-use controller leakage data is within a usable range, the tester resources 605 may save the point-of-use controller leakage data. At operation 1065, the tester resources 605 may reset the mode of the low voltage controller and the point-of-use controller, and proceed to operation 1105 of total gate leakage procedure 1100.

Figure 11:
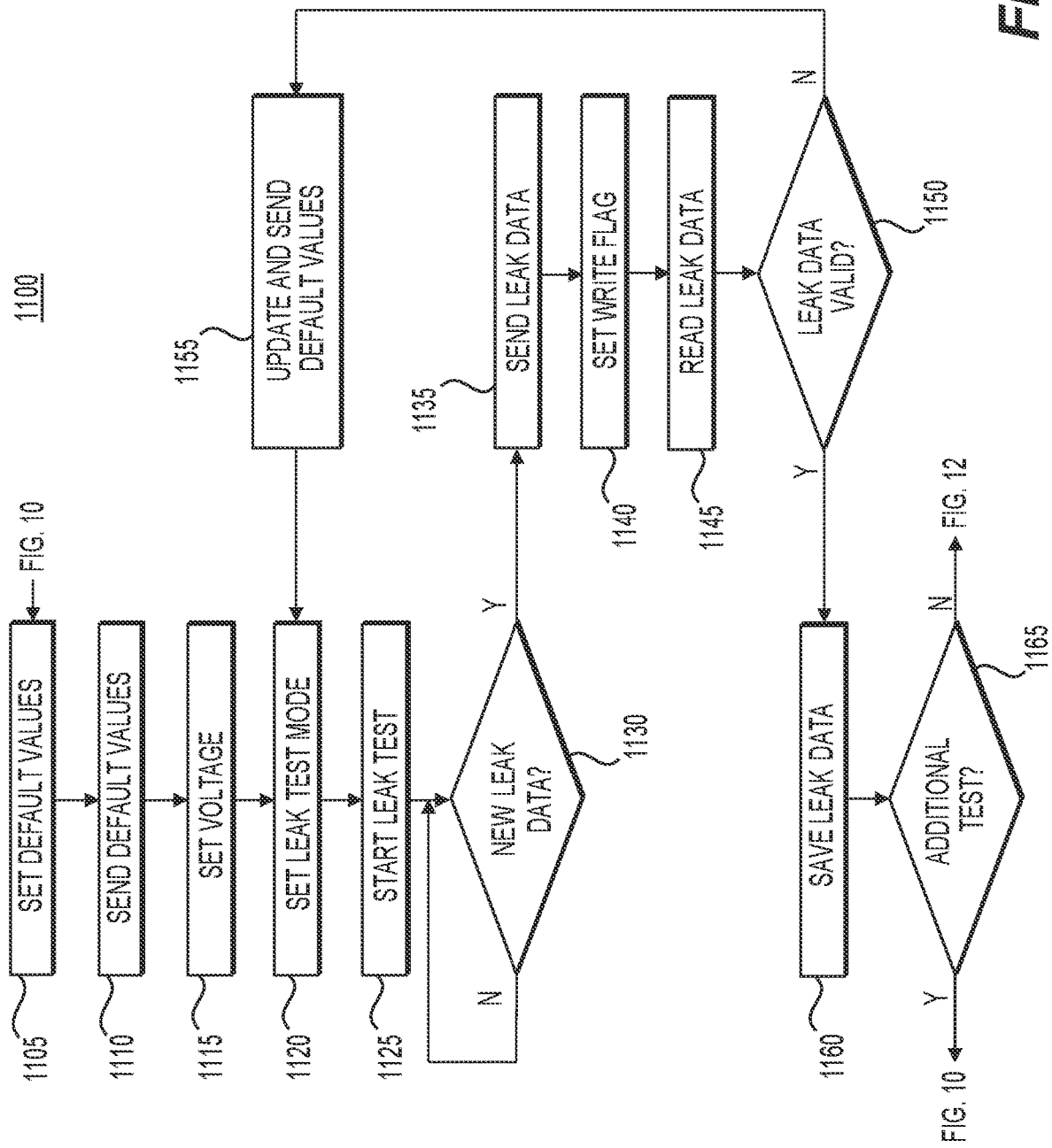
FIG. 11 depicts an exemplary procedure for detecting total gate leakage of a point-of-use controller and a power device switch, according to one or more embodiments.

FIG. 11 depicts an exemplary procedure 1100 for detecting total gate leakage of a point-of-use controller (e.g. point-of-use controller 642) and a power device switch (e.g. point-of-use upper phase controller 142), according to one or more embodiments.

At operation 1105, the tester resources 605 may write, via SPI, for example, default values into a low voltage controller, such as low voltage upper phase controller 120, for example. The default values may include values for a delay register, a count register, a gain register, an offset register, and an address register, for example. At operation 1110, the point-of-use controller may receive the default values. At operation 1115, the tester resources 605 may set VPS and VMS to a desired gate-to-source voltage for a power switch, such as power switch 644, for example. The tester resources 605 may set VPS and VMS for testing a gate-to-source voltage of −8V, 10V, and 19V, for example.

At operation 1120, the tester resources 605 may set the mode of the low voltage controller and the point-of-use controller to detect a gate leakage of the point-of-use controller and the power switch. At operation 1125, the point-of-use controller may perform the leakage operation as described in FIG. 8, for example. At operation 1130, the point-of-use controller may check whether total (point-of-use controller and power switch) leakage data is available from the ADC of the point-of-use controller. At operation 1135, when the total leakage data is available, the point-of-use controller may transmit the total leakage data to the low voltage controller.

At operation 1140, the low voltage controller may set a notification to the tester resources 605 that total leakage data is available. At operation 1145, the tester resources 605 may read the total leakage data and clear the notification. At operation 1150, the tester resources 605 may verify that the total leakage data is within a usable range. At operation 1155, if the total leakage data is not within a usable range, the tester resources 605 may update and send the default values, and proceed to operation 1120 above. At operation 1160, if the total leakage data is within a usable range, the tester resources 605 may save the total leakage data.

At operation 1165, the tester resources 605 may determine whether additional total gate leakage tests with another gate-to-source voltage should be performed. For example, total gate leakage procedure 1100 may be performed three times, with gate-to-source voltages set to −8V for the first total gate leakage test, 10V for the second total gate leakage test, and 19V for the third total gate leakage test. If additional total gate leakage tests should be performed, procedure 1100 may proceed to operation 1065 of point-of-use controller leakage procedure 1000. If no additional total gate leakage tests should be performed, procedure 1100 may proceed to operation 1205 of temperature request procedure 1200.

Figure 12:
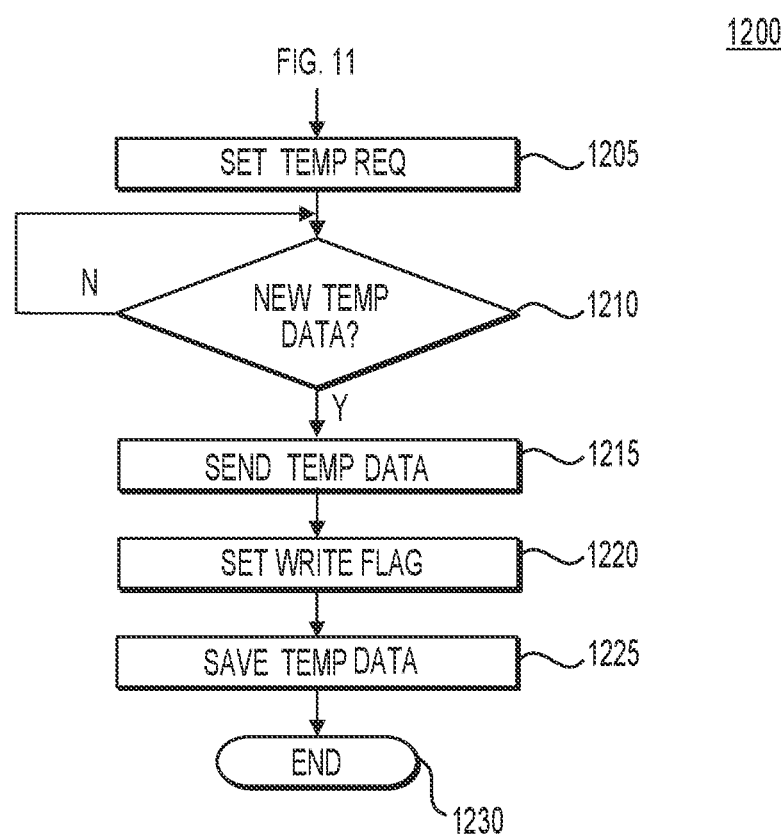
FIG. 12 depicts an exemplary procedure for requesting temperature for use in detecting gate leakage of a power device switch, according to one or more embodiments.

FIG. 12 depicts an exemplary procedure 1200 for requesting temperature for use in detecting gate leakage of a power device switch, according to one or more embodiments.

At operation 1205, the tester resources 605 may set the mode of the low voltage controller and the point-of-use controller to detect a temperature of the point-of-use controller and/or power device switch. At operation 1210, the point-of-use controller may check whether point-of-use controller temperature data is available from the point-of-use controller. At operation 1215, when the point-of-use controller temperature data is available, the point-of-use controller may transmit the point-of-use controller temperature data to the low voltage controller.

At operation 1220, the low voltage controller may set a notification to the tester resources 605 that point-of-use controller temperature data is available. At operation 1225, the tester resources 605 may read the point-of-use controller temperature data, clear the notification, verify that the point-of-use controller temperature data is within a usable range, and save the point-of-use controller temperature data. Procedure 1200 for requesting temperature for use in detecting gate leakage of a power device switch may end at operation 1230.

One or more embodiments may provide a gate leakage detection system that works at integrated circuit level leakage detection. One or more embodiments may provide a gate leakage detection system that performs in mission mode. One or more embodiments may provide a gate leakage detection system with high accuracy and offset correction. One or more embodiments may provide a gate leakage detection system with high resolution. One or more embodiments may provide a gate leakage detection system that is fast and efficient in terms of reliability and efficiency of the system. One or more embodiments may provide a gate leakage detection system with stored data to use for increasing efficiency of the inverter and overall performance of the system. One or more embodiments may provide a gate leakage detection system with offset and temperature compensation, where leakage data is highly reliable and repeatable. One or more embodiments may provide a gate leakage detection system suitable for operation in a high electromagnetic field environment.

One or more embodiments may provide a gate leakage detection system used for end of line gate leakage test and for mission mode gate leakage tests. One or more embodiments may provide a gate leakage detection system integrated in a point-of-use controller, which may conserve board area. One or more embodiments may provide a gate leakage detection system performable during mission mode. One or more embodiments may provide a noninvasive method for gate leakage detection when there is no access to a gate terminal outside a power module.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A system comprising:
an inverter configured to convert DC power from a battery to AC power to drive a motor, wherein the inverter includes:
one or more controllers configured to provide a test signal to control a gate leakage detection operation; and
a power module including:
a phase switch including one or more phase power switches; and
a point-of-use controller configured to detect a gate leakage of the phase switch based on the test signal, wherein the point-of-use controller includes a current to voltage converter and a resistor divider.

2. The system of claim 1, wherein the one or more phase power switches includes one or more silicon carbide dies.

3. The system of claim 1,
wherein the power module is configured to be connected to a terminal of the battery and a phase terminal of the motor.

4. The system of claim 1, wherein a gate terminal of the one or more phase power switches is connected to the point-of-use controller inside the power module.

5. The system of claim 1, wherein the resistor divider generates an output to be received by the current to voltage converter.

6. The system of claim 1, wherein the point-of-use controller includes a switched capacitor amplifier circuit.

7. The system of claim 1, further comprising:
the battery configured to supply the DC power to the inverter; and
the motor configured to receive the AC power from the inverter to drive the motor.

8. A system comprising:
a power module for an inverter, the power module including:
a phase switch including one or more phase power switches; and
a point-of-use controller configured to detect a gate leakage of the phase switch, wherein the point-of-use controller is further configured to detect a characteristic leakage for the point-of-use controller and to detect a gate leakage for the point-of-use controller and the one or more phase power switches, wherein the point-of-use controller includes a resistor divider.

9. The system of claim 8, wherein the point-of-use controller includes an embedded gate leakage measurement circuit configured to detect the gate leakage of the phase switch.

10. The system of claim 8, wherein:
a drain terminal and a source terminal of the one or more phase power switches are externally accessible, and
a gate terminal of the one or more phase power switches is not accessible from an outside of the power module.

11. The system of claim 8, wherein the point-of-use controller is further configured to provide the detected gate leakage to one or more controllers of the inverter.

12. The system of claim 8, wherein the detected gate leakage is an amount of gate to source leakage current of the one or more phase power switches at a gate to source voltage.

13. A system comprising:
one or more point-of use controllers for a power module, the one or more point-of use controllers including a current to voltage converter and a resistor divider, and configured to:
detect a gate leakage of a power switch of the power module based on repeated operations using different specified test voltages.

14. The system of claim 13, wherein the one or more point-of use controllers is further configured to:
provide the detected gate leakage to one or more controllers of an inverter including the power module.

15. The system of claim 13, wherein the one or more point-of use controllers is further configured to:
provide the detected gate leakage to one or more controllers of a tester in an end-of-line test.

16. The system of claim 13, wherein the one or more point-of use controllers is further configured to:
detect the gate leakage of the power switch of the power module at every power up cycle for the power module.

17. The system of claim 13, wherein the one or more point-of use controllers is further configured to:
receive the test voltage;
apply a gate to source voltage to the power switch based on the test voltage; and
measure a gate current of the power switch based on the gate to source voltage, as the detected gate leakage.

18. The system of claim 17, wherein the one or more point-of use controllers is further configured to:
apply the gate to source voltage as 0V;
measure the gate current of the power switch as 0 A; and
measure a current of the one or more point-of use controllers as a characteristic gate leakage of the one or more point-of use controllers.

\* \* \* \* \*